(12) United States Patent
Nishimura et al.

(10) Patent No.: US 8,076,785 B2
(45) Date of Patent: Dec. 13, 2011

(54) SEMICONDUCTOR DEVICE

(75) Inventors: Takao Nishimura, Kawasaki (JP);
Yoshikazu Kumagaya, Kawasaki (JP);
Akira Takashima, Kawasaki (JP);
Kouichi Nakamura, Kawasaki (JP);
Kazuyuki Aiba, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 908 days.

(21) Appl. No.: 11/474,406

(22) Filed: Jun. 26, 2006

(65) Prior Publication Data

US 2006/0289972 A1 Dec. 28, 2006

(30) Foreign Application Priority Data

Jun. 28, 2005 (JP) ................. 2005-188887
Mar. 7, 2006 (JP) ................. 2006-061759

(51) Int. Cl.
*H01L 23/48* (2006.01)
*H01L 23/52* (2006.01)
*H01L 29/40* (2006.01)

(52) U.S. Cl. ........ 257/780; 257/773; 257/777; 257/778; 257/786; 257/E21.503; 257/E23.015; 257/E23.02; 257/E23.021; 257/E23.023

(58) Field of Classification Search ............... 257/773, 257/777, 778, 780, 786, E21.503, E23.015, 257/E23.02, E23.021, E23.023
See application file for complete search history.

(56) References Cited

U.S. PATENT DOCUMENTS

| | | | | |
|---|---|---|---|---|
| 5,550,408 | A | * | 8/1996 | Kunitomo et al. ............ 257/737 |
| 6,525,422 | B1 | * | 2/2003 | Ono et al. ................. 257/737 |
| 6,538,335 | B2 | | 3/2003 | Shimada et al. |
| 6,995,469 | B2 | | 2/2006 | Hatakeyama |
| 7,042,073 | B2 | | 5/2006 | Kado et al. |
| 2002/0185744 | A1 | * | 12/2002 | Katagiri et al. .............. 257/777 |
| 2004/0222532 | A1 | * | 11/2004 | Zeng .............................. 257/772 |
| 2004/0262753 | A1 | * | 12/2004 | Kashiwazaki ................ 257/734 |
| 2006/0189031 | A1 | | 8/2006 | Kado et al. |

FOREIGN PATENT DOCUMENTS

| | | |
|---|---|---|
| JP | 2-163950 A | 6/1990 |
| JP | 10-117065 A | 5/1998 |
| JP | 2004-087575 | 3/2004 |
| JP | 2004-349390 A | 12/2004 |
| JP | 2005-026492 | 1/2005 |

OTHER PUBLICATIONS

Japanese Office Action dated Jan. 18, 2011, issued in corresponding Japanese Patent Application No. 2006-061759 (w/partial English translation).

* cited by examiner

*Primary Examiner* — Lynne A. Gurley
*Assistant Examiner* — Meiya Li
(74) *Attorney, Agent, or Firm* — Westerman, Hattori, Daniels & Adrian, LLP

(57) ABSTRACT

A semiconductor device includes a semiconductor element having a main surface where an outside connection terminal pad is provided. The semiconductor element is connected to a conductive layer on a supporting board via a plurality of convex-shaped outside connection terminals provided on the outside connection terminal pad and a connection member; and the connection member commonly covers the convex-shaped outside connection terminals.

1 Claim, 15 Drawing Sheets

SEMICONDUCTOR DEVICE

BACKGROUND OF THE INVENTION

1. Field of the Invention

The present invention generally relates to semiconductor devices, and more specifically, to a semiconductor device having an electrode connection structure where a convex-shaped electrode provided on a main surface of a semiconductor element is connected and fixed to a conductive layer selectively provided on a main surface of a supporting board.

2. Description of the Related Art

A semiconductor device where a semiconductor element is mounted on a supporting board in a so-called face down state has been used. In the semiconductor device, a basic material of the supporting board is insulation resin such as glass-epoxy resin. The supporting board is formed by laminating plural wiring boards having surfaces where conductive layers made of copper (Cu) or the like are selectively provided. A convex-shaped electrode provided on a main surface of a semiconductor element is connected to the conductive layer selectively provided on the main surface of the supporting board. An outside connection terminal such as a spherical-shaped electrode terminal is provided on the surface of the conductive layer selectively provided on the other main surface of the supporting board.

Under this structure an gold (Au) ball is pressure-fixed and connected on an outside connection terminal pad on the main surface of the semiconductor element by a wire ball bonding method, so that the convex-shaped outside connection terminal having both a base part and a part projecting from the base part is formed. A flattening process is, if necessary, applied to the part projecting from the base part. A terminal having such a structure, namely the terminal formed by a wire made of soft metal such as gold (Au) and having the base part and the part projecting from the base part is called a ball bump.

Since such a terminal having the base part and the part projecting from the base part has a large surface area, the terminal is easily connected and fixed to the conductive layer on the supporting board by a conductive member such as solder.

Such a connection structure can be realized at relatively low cost. Therefore, this structure is applied to a relatively small-sized semiconductor element having several through several hundreds outside connection terminals. See Japanese Patent Application Publication No. 2-163950 and Japanese Patent Application Publication No. 10-117065.

In order to form the semiconductor device, after a conductive member such as solder is selectively provided on a surface of the conductive layer provided on the main surface of the supporting board, the convex-shaped outside connection terminals of the semiconductor element come in contact with the conductive member. In this state, the conductive member is heated to a temperature equal to or greater than the melting point so as to be melted.

After that, the temperature is decreased so as to be equal to or less than the melting point of the conductive member such as a room temperature, so that the conductive member is solidified. As a result of this, the convex-shaped outside connection terminal of the semiconductor element is mechanically and electrically connected to the conductive layer on the supporting board.

However, since processes for increasing or decreasing the temperature are applied in this example as discussed above, stress based on the difference between coefficients of thermal expansion of the semiconductor element and the supporting board is concentrated on the conductive member between the convex-shaped outside connection terminal of the semiconductor element and the conductive layer on the supporting board. As a result of this, a crack may be generated in the conductive member so that an electrical connection between the convex-shaped outside connection terminal of the semiconductor element and the conductive layer on the supporting board is broken.

Even if a crack is not generated just after the temperature is decreased, the stress is concentrated on and remains in the conductive member between the convex-shaped outside connection terminal of the semiconductor element and the conductive layer on the supporting board. Therefore, a crack may be generated due to change of the temperature or vibration in the manufacturing process right after this process.

In addition, even if a crack is not generated in the manufacturing process, a crack may remain when the semiconductor device is actually working, so that reliability of the semiconductor device may be degraded.

In a case where a thin board such as a both surfaces wiring board is used as the supporting board, the board may have a large amount of warpage. Therefore, in this case, a crack may be generated.

SUMMARY OF THE INVENTION

Accordingly, embodiments of the present invention may provide a novel and useful semiconductor device solving one or more of the problems discussed above.

One aspect of the present invention may be to provide a semiconductor device whereby a mechanical and electrical connection between the convex-shaped outside connection terminal of the semiconductor element and the conductive layer on the supporting board can be realized with high reliability.

According to the embodiments of the present invention, a semiconductor device, including: a semiconductor element having a main surface where an outside connection terminal pad is provided; wherein the semiconductor element is connected to a conductive layer on a supporting board via a plurality of convex-shaped outside connection terminals provided on the outside connection terminal pad and a connection member; and the connection member commonly covers the convex-shaped outside connection terminals, is provided.

According to the embodiments of the present invention, a semiconductor device including: a semiconductor element, including a semiconductor substrate; an outside connection terminal pad provided on a main surface of the semiconductor substrate; and a plurality of convex-shaped outside connection terminals provided on the outside connection terminal pad; a supporting board, including an insulation substrate; a conductive layer provided on a main surface of the insulation substrate; and an insulation layer provided on the main surface of the insulation substrate so as to selectively cover the conductive layer; and a connection member configured to commonly cover and fix the convex-shaped outside connection terminals to a part of the conductive layer not covered with the insulation layer, is provided.

According to the embodiments of the present invention, a semiconductor device, including: a semiconductor element wherein a plurality of outside connection terminal pads are provided on a main surface of a semiconductor substrate; and at least a single first convex-shaped outside connection terminal is provided on the outside connection terminal pad; and a supporting board wherein a plurality of conductive layers corresponding to the outside connection terminal pads are provided; and at least a single second convex-shaped outside connection terminal is provided on the conductive layer;

wherein the first convex-shaped outside connection terminal is connected to the conductive layer via a connection member; and the second convex-shaped outside connection terminal is connected to the outside connection terminal pad via the connection member, is provided.

According to the embodiments of the present invention, a semiconductor device, including: a supporting board; and a semiconductor element mounted on a wiring board which wiring board is mounted on the supporting board, the semiconductor element connected to the supporting board via the wiring board; wherein a plurality of semiconductor element outside connection terminal pads is provided on a main surface of a semiconductor substrate of the semiconductor element, the main surface facing the wiring board, and at least a single first convex-shaped outside connection terminal is provided on the semiconductor element outside connection terminal pad; a plurality of wiring board outside connection terminal pads is provided on a main surface of the wiring board, the main surface facing the semiconductor element, and at least a single second convex-shaped outside connection terminal is provided on the wiring board outside connection terminal pad; the first convex-shaped outside connection terminal is connected to the wiring board outside connection terminal pad via a connection member; and the second convex-shaped outside connection terminal is connected to the semiconductor element outside connection terminal pad via the connection member, is provided.

According to the above-mentioned semiconductor device, at least two convex-shaped outside connection terminals are provided on a single outside connection terminal pad of the semiconductor element.

Therefore, areas facing each other of the convex-shaped outside connection terminals in a single outside connection terminal pad of the semiconductor element and the conductive layer on the supporting board are increased to approximately double in size. In other words, since the areas facing each other of the convex-shaped outside connection terminals of the semiconductor element and the conductive layer on the supporting board are increased, even if the stress generated due to the increase or decrease of the temperature is concentrated on or remains between the convex-shaped outside connection terminals of the semiconductor element and the conductive layer on the supporting board, the stress is dispersed in a wider range.

As a result of this, the probability of a crack being generated in an entire area of the connection member between the convex-shaped outside connection terminal of the semiconductor element and the conductive layer on the supporting board is drastically decreased.

Therefore, mechanical and electrical connection between the semiconductor element and the supporting board can be realized with high reliability.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 1 through FIG. 15 of embodiments of the present invention.

First Embodiment

Figure 1:
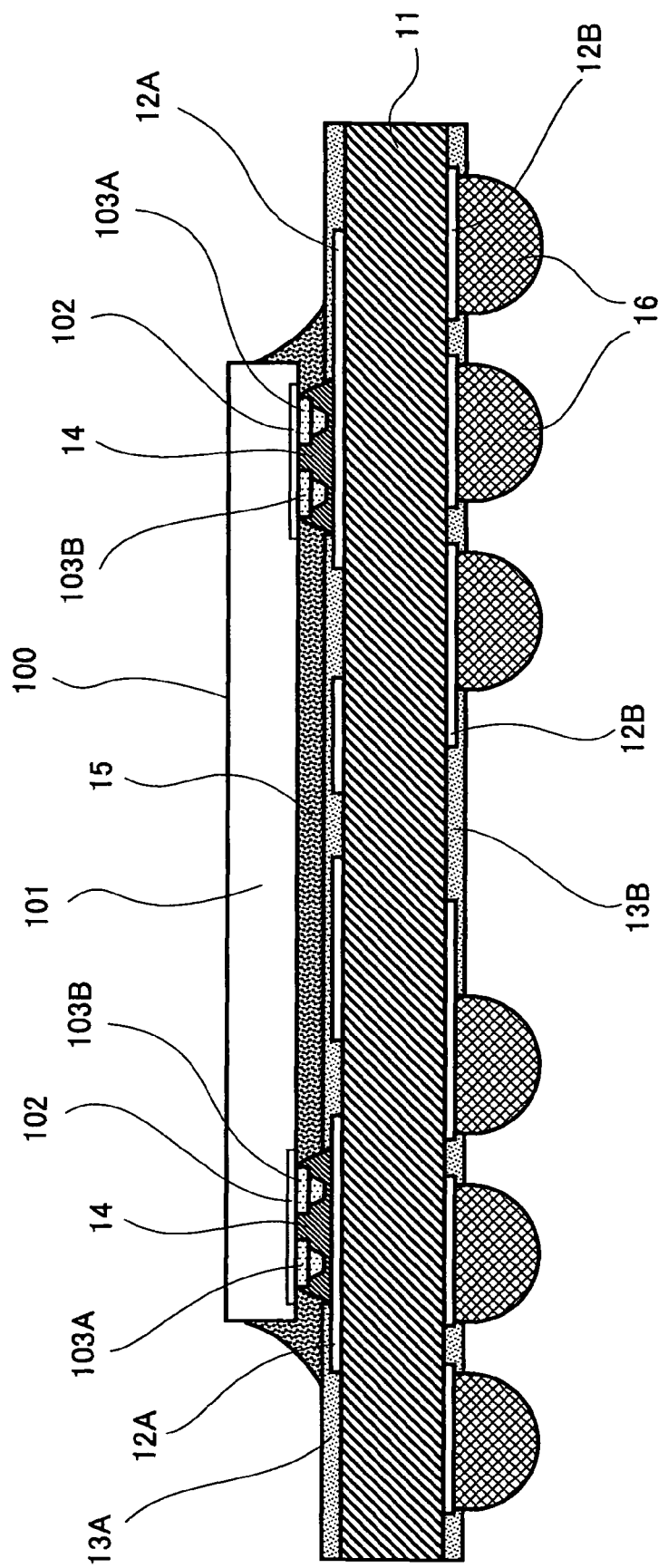
FIG. 1 is a cross-sectional view of a semiconductor device of a first embodiment of the present invention.

A semiconductor device of a first embodiment of the present invention wherein a convex-shaped outside connection terminal of a semiconductor element and a conductive layer on a supporting board are mechanically and electrically connected is shown in FIG. 1. Here, FIG. 1 is a cross-sectional view of the semiconductor device of the first embodiment of the present invention.

Referring to FIG. 1, a semiconductor device includes a supporting board 11. A basic material of the supporting board 11 is insulation resin such as glass-epoxy resin. The supporting board 11 is formed by laminating plural wiring boards having surfaces where conductive layers made of copper (Cu) or the like are selectively provided. The supporting board 11 may be called an interposer or a wiring board.

A conductive layer 12A made of copper (Cu) is selectively provided on a main surface of the supporting board 11. The conductive layer 12A includes a wiring layer and a conductive layer where concave-shaped outside connection terminals 103A and 103B (also referred to collectively as convex-shaped outside connection terminal 103) of a semiconductor element 100 are connected. The conductive layers 12A other than areas where the concave-shaped outside connection terminals 103A and 103B of a semiconductor element 100 are connected are selectively covered with a solder resist layer 13A. In other words, the solder resist layer 13A exposes an area in the conductive layer 12A, the area being where the semiconductor element 100 is connected.

The semiconductor element 100 is a semiconductor integrated circuit that includes a silicon (Si) semiconductor substrate 101 and is formed by a well-known semiconductor manufacturing process.

The present invention can be applied to a case where a chemical semiconductor such as gallium arsenide (GaAs) is used as the semiconductor substrate.

In this embodiment, plural outside connection terminal pads 102 are selectively arranged on a main surface of the semiconductor substrate 101. For example, the outside connection terminal pads 102 may be provided in the vicinities of and along four sides of the main surface of the semiconductor substrate 101. Alternatively, the outside connection terminal pads 102 may be provided in the vicinities of and along two sides facing each other of the main surface of the semiconductor substrate 101. Two convex-shaped outside connection terminals 103A and 103B are provided on the outside connection terminal pad 102 so as to form a line.

In other words, on the outside connection terminal pad 102, the convex-shaped outside connection terminals 103A and 103B are arranged so as to form a line in a direction perpendicular to an extending direction at edge parts of the semiconductor element 100.

In FIG. 1, illustrations of an active element and/or passive element formed in the silicon (Si) semiconductor substrate 101 of the semiconductor element 100 and a multi-layers wiring layer and/or a rewiring layer formed on the main surface of the semiconductor element 100 are omitted.

The outside connection terminal pad 102 is made of aluminum (Al), copper (Cu), alloy of these such as Al95%-Cu5%, and others. Furthermore, the convex-shaped outside connection terminal 103 is formed by the following process. That is, an gold (Au) ball is pressure-fixed and connected on an outside connection terminal pad 102 on the main surface of the semiconductor element 100 by a wire ball bonding method so that a base part of the convex-shaped outside connection terminal 103 is formed. In addition, a convex-shaped part projecting from the base part of the convex-shaped outside connection terminal 103 is formed in a body with the base part. A flattening process is, if necessary, applied to the part projecting from the base part.

It is preferable that a gold (Au) layer be formed on an uppermost layer, namely an exposed surface, of the outside connection terminal pad 102 by an electrolytic plating method, an evaporation method, or the like.

The convex-shaped outside connection terminals 103A and 103B of the semiconductor element 100 and corresponding conductive layer 12A on the supporting board 11 are commonly covered with a connection member 14 made of solder or a conductive adhesive agent so as to be mechanically and electrically connected. Two convex-shaped outside connection terminals 103A and 103B are connected and fixed to the conductive layer 12A with a wide contact area.

In other words, the semiconductor element 100 is mounted on and fixed to the main surface of the supporting board 11 in a flip chip (face down) state.

In addition, an underfill member 15 whose main ingredient is epoxy group resin is supplied between the semiconductor element 100 and the main surface of the supporting substrate 11.

On the other hand, a conductive layer 12B for providing outside connection terminals 16, the conductive layer 12B including a wiring layer, is selectively provided on the other main surface of the supporting board 11. The conductive layer 12B is selectively covered with a solder resist layer 13B. The solder resist layer 13B defines an arrangement area of the outside connection terminal 16. The outside connection terminals 16 whose main ingredient is solder are provided on the conductive layer 12B exposed through by the solder resist layer 13B.

The structure of the outside connection terminals 16 at the supporting board 11 is not limited to that of this embodiment. For example, the outside connection terminal 16 may be provided in the periphery of the semiconductor element 100 on the main surface of the supporting board 11 where the semiconductor element 100 is mounted. In addition, the arrangement of the outside connection terminal 16 may be properly selected from a wire bonding structure, a ball grid array (BGA) structure, and others.

Furthermore, the supporting board 11 is not limited to the above-mentioned multi-layer wiring board. For example, a both surfaces wiring board having conductive layers provided on both front surface and rear surface of a single insulation board, a single surface wiring board where a conductive layer is provided on a single surface of the single insulation board, and others may be used as the supporting board 11.

Figure 2:
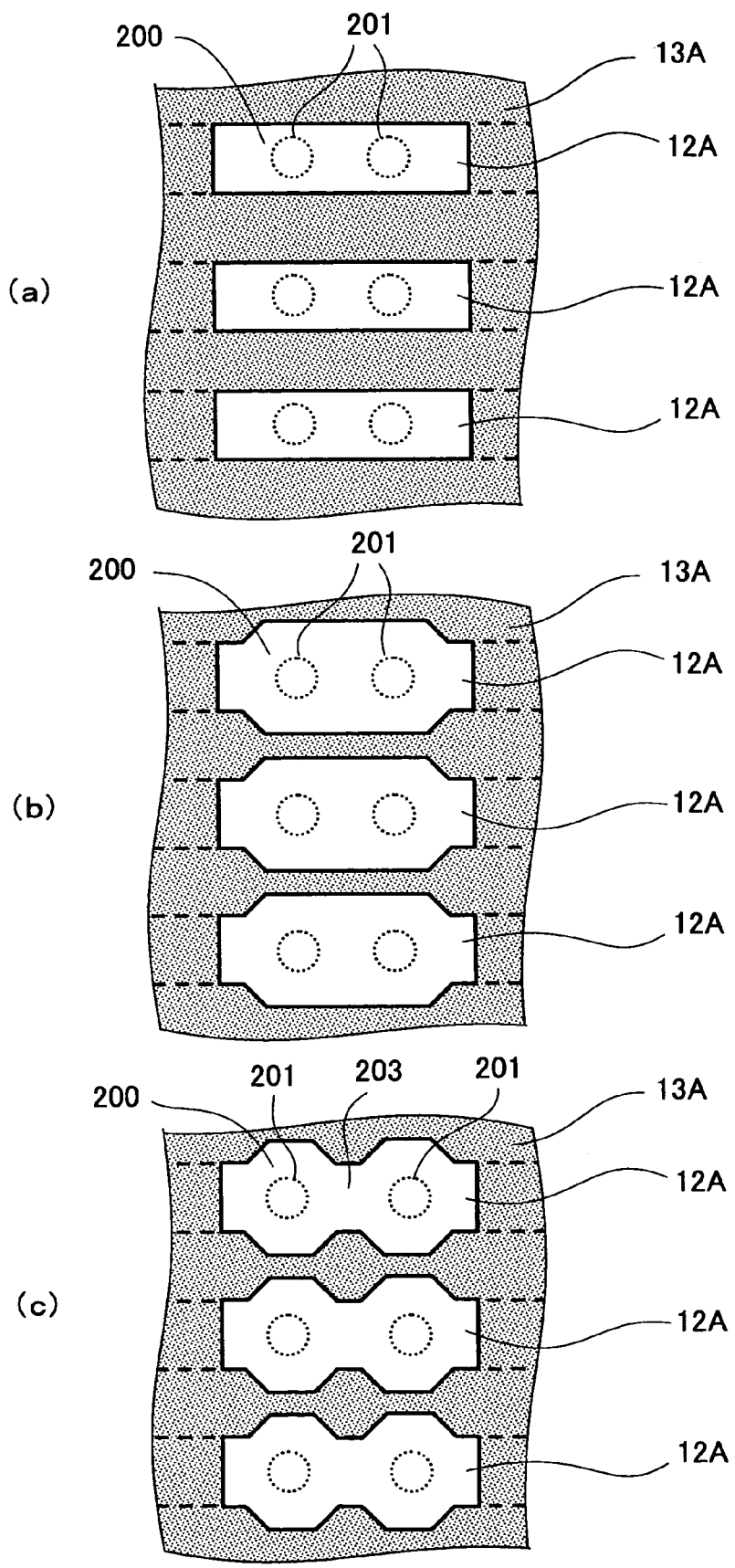
FIG. 2 is a plan view of the semiconductor device of the first embodiment of the present invention and shows configurations of conductive layers provided on a main surface of a supporting board.

A plan view of the conductive layer 12A where the convex-shaped outside connection terminals 103A and 103B of the semiconductor element 100 are connected, on the main surface of the supporting board 11, is shown in FIG. 2. FIG. 2 shows where three conductive layers 12A are arranged so as to form a line.

In an example shown in FIG. 2-(a), the connection area 200 of the conductive layer 12A where the convex-shaped outside connection terminals 103 are connected is exposed through the solder resist layer 13A. The conductive area 12A has constant width. In the connection area 200, circles 201 show parts where the convex-shaped outside connection terminals 103A and 103 of the semiconductor element 100 are connected.

In an example shown in FIG. 2-(b), the connection area 200 of the conductive layer 12A where the convex-shaped outside connection terminals 103 are connected is exposed through the solder resist layer 13A. The conductive area 12A in FIG. 2-(b) has a wider part than the conductive area 12A in FIG. 2-(a). In the connection area 200, circles 201 show parts where the convex-shaped outside connection terminals 103A and 103B of the semiconductor element 100 are connected.

According to the example shown in FIG. 2-(b), as compared to the example shown in FIG. 2-(a), it is possible to increase the amount of the connection member 14 which can be received on the connection area 200. Therefore, connection between the concave-shaped outside connection terminals 103A and 103B and the conductive layer 12A can be made securely.

On the other hand, in the example shown in FIG. 2-(c), the connection area 200 of the conductive layer 12A where the convex-shaped outside connection terminals 103 are connected is exposed through the solder resist layer 13A. The conductive area 12A has both the wider parts and the narrower parts. The narrower part of the conductive area 12A is situated between the wider parts where the convex-shaped outside connection terminals 103A and 103B are connected. In the connection area 200, circles 201 show parts where the convex-shaped outside connection terminals 103A and 103B of the semiconductor element 100 are connected.

According to the example shown in FIG. 2-(c), as compared to the example shown in FIG. 2-(a), it is possible to increase the amount of the connection member 14 which can be received on the connection area 200. In addition, since the part situated between the parts where the convex-shaped outside connection terminals 103A and 103B are connected has a narrow width, it is possible to easily control the amount of the connection member 14 to be a designated not too much amount.

Under this structure, connection between the concave-shaped outside connection terminals 103A and 103B and the conductive layer 12A can be made securely. In addition, even if a pad pitch of the outside connection terminal pads 102 of the semiconductor element 100 is minute, it is possible to prevent generation of a short circuit due to a bridge of the connection member 14 between the neighboring outside connection terminal pads 102.

As discussed above, in the structures shown in FIG. 2-(a) through FIG. 2-(c), the conductive area 12A provided on the supporting board 11 exposes the connection areas 200 where the convex-shaped outside connection terminals 103 of the semiconductor element 100 are connected. The periphery of the connection areas 200 is covered with the solder resist layer 13A.

The solder resist 13A covering the conductive layer 12A to which the convex-shaped outside connection terminals 103A and 103B of the semiconductor element 100 are connected at the main surface of the supporting board 11 is not limited to these configurations.

Figure 3:
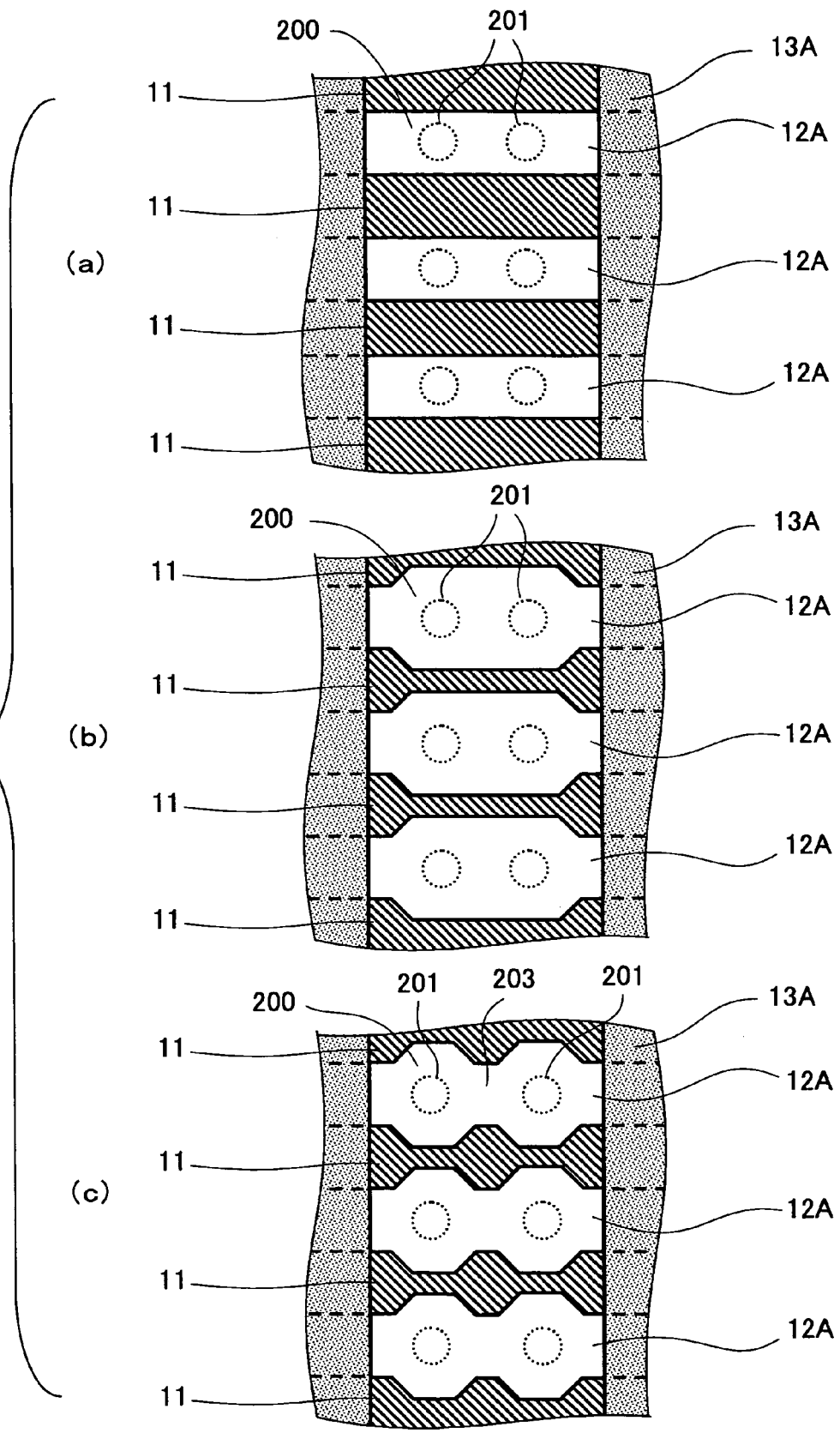
FIG. 3 is a plan view of a modified example the semiconductor device of the first embodiment of the present invention and shows configurations of conductive layers provided on a main surface of a supporting board of the modified example.

A modified example of the covering configuration of the solder resist 13A is shown in FIG. 3. The configurations of the conductive layer 12A shown in FIG. 3-(a) through FIG. 3-(c) correspond to the configurations of the conductive layer 12A shown in FIG. 2-(a) through FIG. 2-(c).

In the example shown in FIG. 3, neighboring conductive layers 12A are commonly covered with the solder resist 13A in a position remote from the connection areas 201. The solder resist 13A is not provided between neighboring connection areas 201 so that the supporting board 11 is exposed.

Such a covering example of the solder resist can be applied to a case where a gap of the neighboring conductive layers 12A is narrow.

Figure 4:
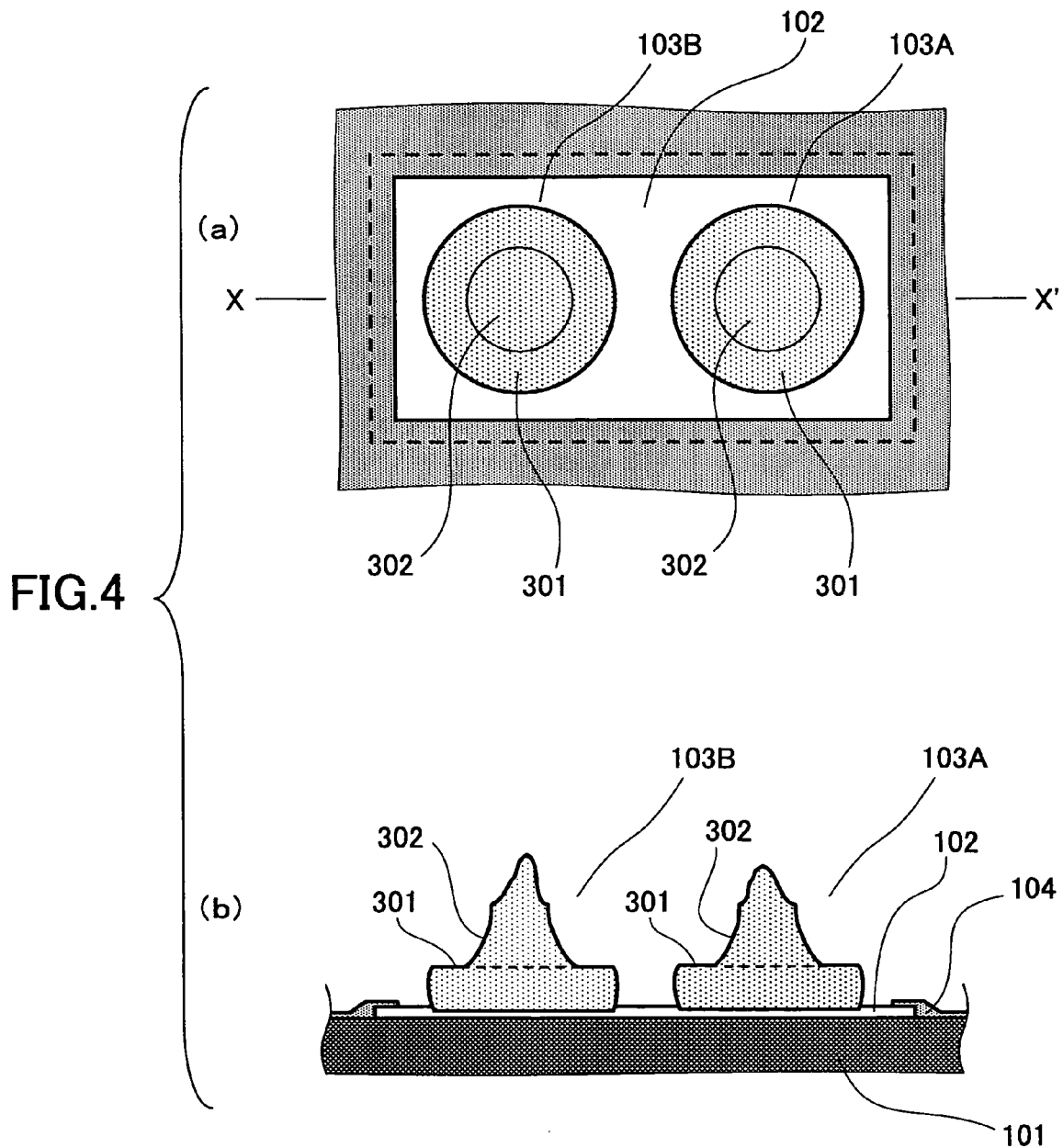
FIG. 4 provides plan and cross-sectional views showing a structure of convex-shaped outside connection terminals of a semiconductor element is used in the semiconductor device of the first embodiment of the present invention.

FIG. 4 provides plan and cross-sectional views showing convex-shaped outside connection terminals 103A and 103B provided on a single outside connection terminal pad 102. FIG. 4-(b) is a cross-sectional view taken along a line X-X of FIG. 4-(a).

In FIG. 4, a numerical reference 101 represents a silicon (Si) substrate, and a numerical reference 104 is a surface protection layer made of silicon nitride ($Si_3N_4$). In FIG. 4, illustrations of other conductive layers or insulation layers on the main surface of the silicon (Si) semiconductor substrate 101 are omitted.

Referring to FIG. 4, an gold (Au) ball is pressure-fixed and connected on an outside connection terminal pad 102 on the main surface of the semiconductor element 100 so that base parts 301 of the convex-shaped outside connection terminals 103A and 103B are formed. In addition, a part 302 projecting from the base part 301 is formed in a body so that the convex-shaped outside connection terminal 103 is formed. The part 302 projecting from the base part 301 is made by forming a part of the gold (Au) ball based on a configuration of the head end part of a bonding tool not illustrated in FIG. 4. A flattening process may be, if necessary, applied to the part 302 projecting from the base part 301. However, in this example, the flattening process is omitted.

It is preferable that the convex-shaped outside connection terminals 103A and 103B are situated as close as possible to each other. While there is a limitation on the positions of the convex-shaped outside connection terminals 103A and 103B due to the configuration of the head end part of the bonding tool, the space between the convex-shaped outside connection terminals 103A and 103B is reduced by providing the base part 301A of the convex-shaped outside connection terminal 103A and the base part 301B of the convex-shaped outside connection terminal 103B. As a result of this, flowing-in of the connection member 14 can be easily accomplished so that a non-filling area of the connection member 14, namely void, is not formed between the convex-shaped outside connection terminals 103A and 103B.

Since the non filling area is not formed in the connection member 14, it is possible to prevent the non filling area of the underfill member 15 from being formed between the convex-shaped outside connection terminals 103A and 103B when the underfill member 15 is supplied in a space between the semiconductor element 100 and the supporting board 11. Under this structure, it is possible to prevent reduction of the reliability of the semiconductor device due to voids in the underfill member 15.

Figure 5:
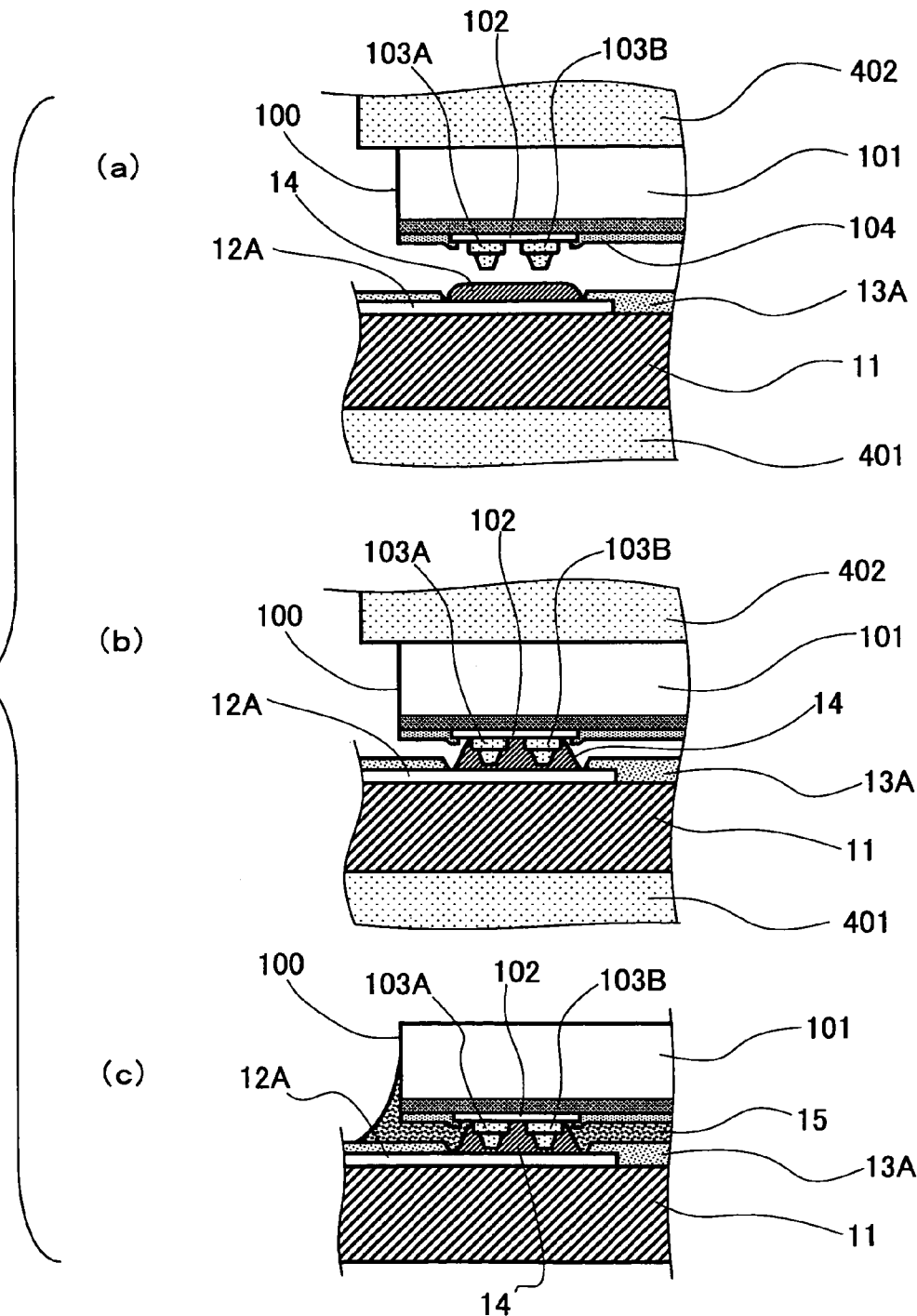
FIG. 5 is a cross-sectional view showing a manufacturing process of the semiconductor device of the first embodiment of the present invention.

A manufacturing process of the semiconductor device in the first embodiment is shown in FIG. 5.

FIG. 5-(a) shows a state where the supporting board 11 mounted on and fixed to a bonding stage 401 faces the semiconductor element 100 held by a suction jig 402.

The conductive layer 12A on the main surface of the supporting board 11 is selectively covered, in advance, with the connection member 14, for example, made of solder whose main ingredient is tin (Sn).

The connection member 14 may be formed by a printing method, a plating method, evaporation and reflow method, or the like. The thickness of the connection member 14 may be approximately 5 μm through 70 μm. While the conductive layer 12A is formed of copper (Cu) having thickness of approximately 9 μm through 25 μm, the material for the conductive layer 12A may be properly selected from other materials.

The thickness of the solder resist layer 13A may be approximately 5 μm through 25 μm.

As discussed above, since the structure of the outside connection terminal on the supporting board 11 may be selected from various structures, illustrations of the conductive layer and others on other main surface of the supporting board 11 are omitted in this example.

On the other hand, in the semiconductor element 100, the convex-shaped outside connection terminals 103A and 103B are provided on the outside connection terminal pad 102 exposed through the insulation layer 104 including the multi-layer wiring layer formed on the main surface of the silicon (Si) semiconductor substrate 101.

The outside connection terminal pad 102 is formed of aluminum (Al) with thickness approximately 0.4 μm through 1.5 μm.

In addition, the gold (Au) ball is pressure-fixed and connected on an outside connection terminal pad 102 on the main surface of the semiconductor element 100 so that the base parts 301 (See FIG. 4) of the convex-shaped outside connection terminals 103A and 103B are formed. In addition, the part 302 projecting from the base part 301 is formed in a body so that the convex-shaped outside connection terminal 103 is formed.

The base part 301 has a diameter of approximately 30 μm through 60 μm and thickness of approximately 5 μm through 25 μm. On the other hand, the part 302 projecting from the base part 301 has a diameter of approximately 10 μm through 50 μm and thickness of approximately 10 μm through 70 μm.

These dimensions are, based on a design rule with respect to the semiconductor element, properly selected based on the area of the terminal pad, the gap between the neighboring terminal pads, the height required for the semiconductor device, and others.

In addition to the wire ball bonding method, an electrolytic plating method or non-electrolytic plating method may be applied for forming the convex-shaped outside connection terminals 103A and 103B on the surface of the outside connection terminal pad 102. For example, a plating method whereby a metal such as gold (Au), copper (Cu) or Nickel (Ni) is deposited on the surface of the outside connection terminal pad 102 may be applied so that the convex-shaped outside connection terminals 103A and 103B are formed on the surface of the outside connection terminal pad 102.

It is preferable that a gold (Au) layer be formed on an exposed surface (uppermost layer) of the outside connection terminal pad 102 by the electrolytic method, an evaporation method, or the like.

As discussed above, in a state where the conductive layer 12A and the convex-shaped outside connection terminals 103A and 103B are positioned so as to face each other, the bonding stage 401 is heated so that the temperature is higher than the melting point of the connection member 14. In addition, the suction jig 402 is lowered so that the convex-shaped outside connection terminals 103A and 103B are pressed in the molten connection member 14.

As a result of this, the connection member 14 covers the convex-shaped outside connection terminals 103A and 103B and comes in contact with % the exposed surface of the outside connection terminal pad 102 so that the conductive layer 12A and the outside connection terminal pad 102 are connected. At this time, a space between the convex-shaped outside connection terminals 103A and 103B is filled with the connection member 14. This state is shown in FIG. 5-(b).

Instead of heating the bonding stage 401, the semiconductor element 100 may be held by the suction jig 402 heated to a designated temperature such as approximately 280° C. through 300° C. in advance so that the heated convex-shaped outside connection terminals 103A and 103B may be made come in contact with the connection member 14, so that the temperature of the connection member 14 is increased and the connection member 14 is melted.

In addition, the bonding stage 401 may be heated to a designated temperature such as approximately 50° C. through 100° C. in advance and preheating may be applied to the supporting board 11, so that the temperature of the connection member 14 can be increased in a short period of time.

Thus, the convex-shaped outside connection terminals 103A and 103B of the semiconductor element 100 are connected and fixed to the conductive layer 12A on the supporting board 11 and the semiconductor element 100 is mounted on the supporting board 11. After that, the underfill member 15 whose main ingredient is epoxy group resin is supplied between the supporting board 11 and the semiconductor element 100. This state is shown in FIG. 5-(c).

After that, the outside connection terminals 16 shown in FIG. 1 are formed on the same or the other main surface of the supporting board 11.

Second Embodiment

Figure 6:
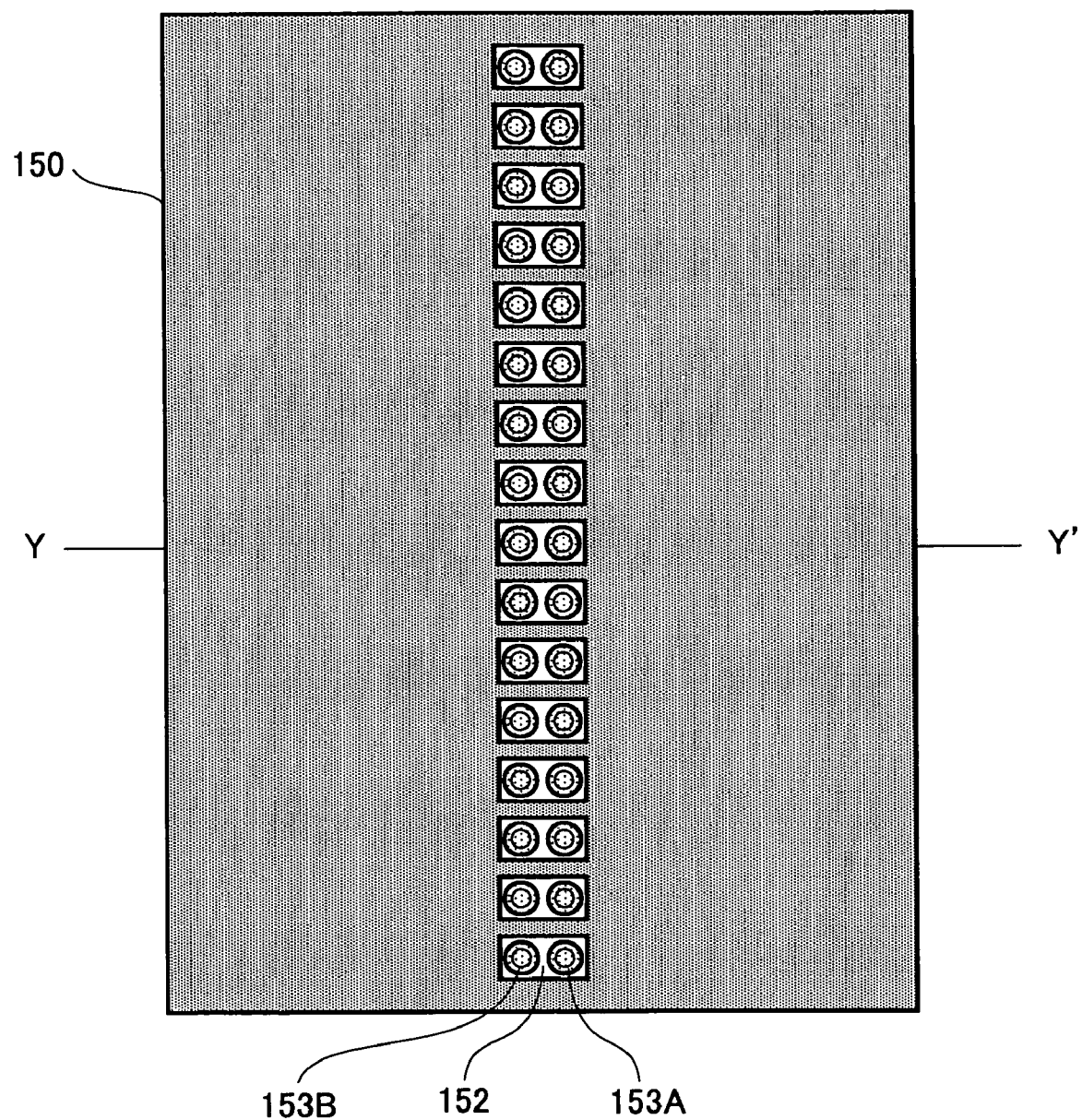
FIG. 6 is a plan view of a main surface of a semiconductor element where convex-shaped outside connection terminals are provided in a semiconductor device of a second embodiment of the present invention.
Figure 7:
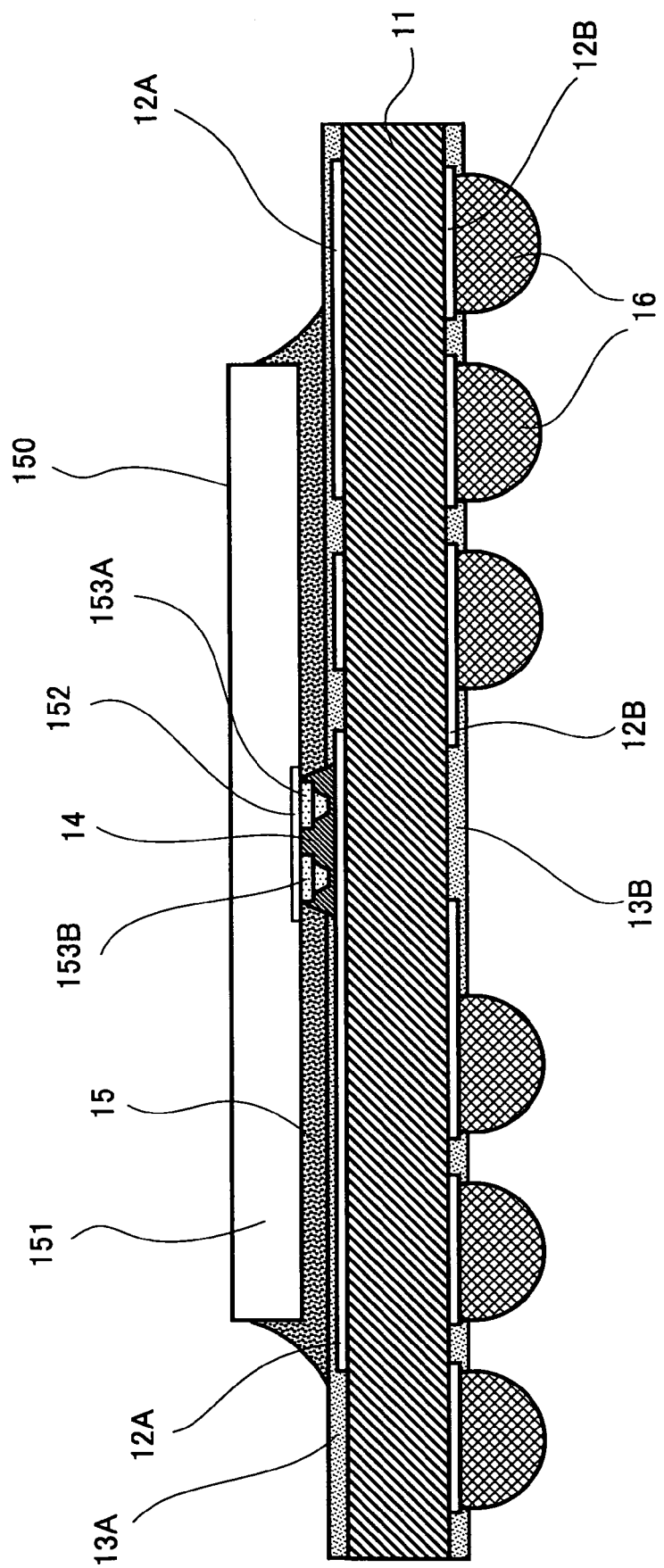
FIG. 7 is a cross-sectional view of the semiconductor device of the second embodiment of the present invention.

A semiconductor device of a second embodiment of the present invention is shown in FIG. 6 and FIG. 7.

FIG. 7 shows a semiconductor device wherein a semiconductor element 150 shown in FIG. 6 is mounted on the supporting board 11. The semiconductor element 150 of FIG. 7 shows a cross section taken along a line Y-Y' of FIG. 6.

In the second embodiment of the present invention, parts that are the same as the parts discussed in the first embodiment of the present invention are given the same reference numerals, and explanation thereof is omitted.

Referring to FIG. 6 and FIG. 7, in the semiconductor device of the second embodiment of the present invention, the semiconductor device 150 such as a DRAM (Dynamic Random Access Memory) is flip chip connected to the supporting board 11. The semiconductor element 150 has a structure where plural outside connection terminal pads 152 are arranged in the center part of the semiconductor substrate 151 so as to form a line.

In the semiconductor device of the second embodiment of the present invention, as well as the semiconductor device of the first embodiment of the present invention, convex-shaped outside connection terminals 153A and 153B provided on the outside connection terminal pad 152 are fixed to the conductive layer 12A provided on the main surface of the supporting board 11 via the connection member 14 commonly covering the convex-shaped outside connection terminals 153A and 153B.

In the semiconductor device of this embodiment, plural outside connection terminal pads 152 are provided in a substantially center of the semiconductor substrate 151 of the semiconductor element 150 in a line.

Accordingly, in a manufacturing process of the semiconductor device or the semiconductor device itself, stress based on the difference between coefficients of thermal expansion of the semiconductor element 150 and the supporting board 11 may be concentrated on the connection member 14 between the convex-shaped outside connection terminals 153A and 153B provided in a substantially center of the semiconductor substrate 151 and the conductive layer 12A on the supporting board 11. As a result of this, a crack may be generated in the connection member 14 so that electrical connection is broken between the convex-shaped outside connection terminals 153A and 153B and the conductive layer 12A.

However, in this embodiment, two convex-shaped outside connection terminals 153A and 153B are provided on a single outside connection terminal pad 152 and connected to and fixed to the conductive layer 12A provided on the main surface of the supporting board 11 via the connection member 14 commonly covering the convex-shaped outside connection terminals 153A and 153B.

In other words, the convex-shaped outside connection terminals 153A and 153B are provided on the outside connection terminal pad 152 in a direction perpendicular to an extending direction of the pad arrangement.

Accordingly, a contact area with the connection member 14 provided between the convex-shaped outside connection terminals 153A and 153B of the semiconductor element 150 and the conductive layer 12A on the supporting board 11 is increased. Hence, even if the stress based on the difference between coefficients of thermal expansion of the semiconductor element 150 and the supporting board 11 is concentrated on the connection member 14 between the convex-shaped outside connection terminals 153A and 153B and the conductive layer 12A on the supporting board 11, the stress is scattered in a wide range.

Therefore, the probability of a crack being generated in an entire area of the connection member 14 provided between the convex-shaped outside connection terminals 153A and 153B and the conductive layer 12A on the supporting board 11 is drastically decreased. Thus, in this embodiment, it is possible to realize the electrical and mechanical connections between the semiconductor element 150 and the supporting board 11 with high reliability.

The structure shown in FIG. 2 or FIG. 3 may be applied as the structure of the conductive layer 12A in this embodiment. In addition, the structure shown in FIG. 4 may be applied as the structure of the convex-shaped outside connection terminals 153A and 153B.

Furthermore, the process shown in FIG. 5 may be applied as a process for mounting the semiconductor element 150 on the supporting board 11.

Third Embodiment

Figure 8:
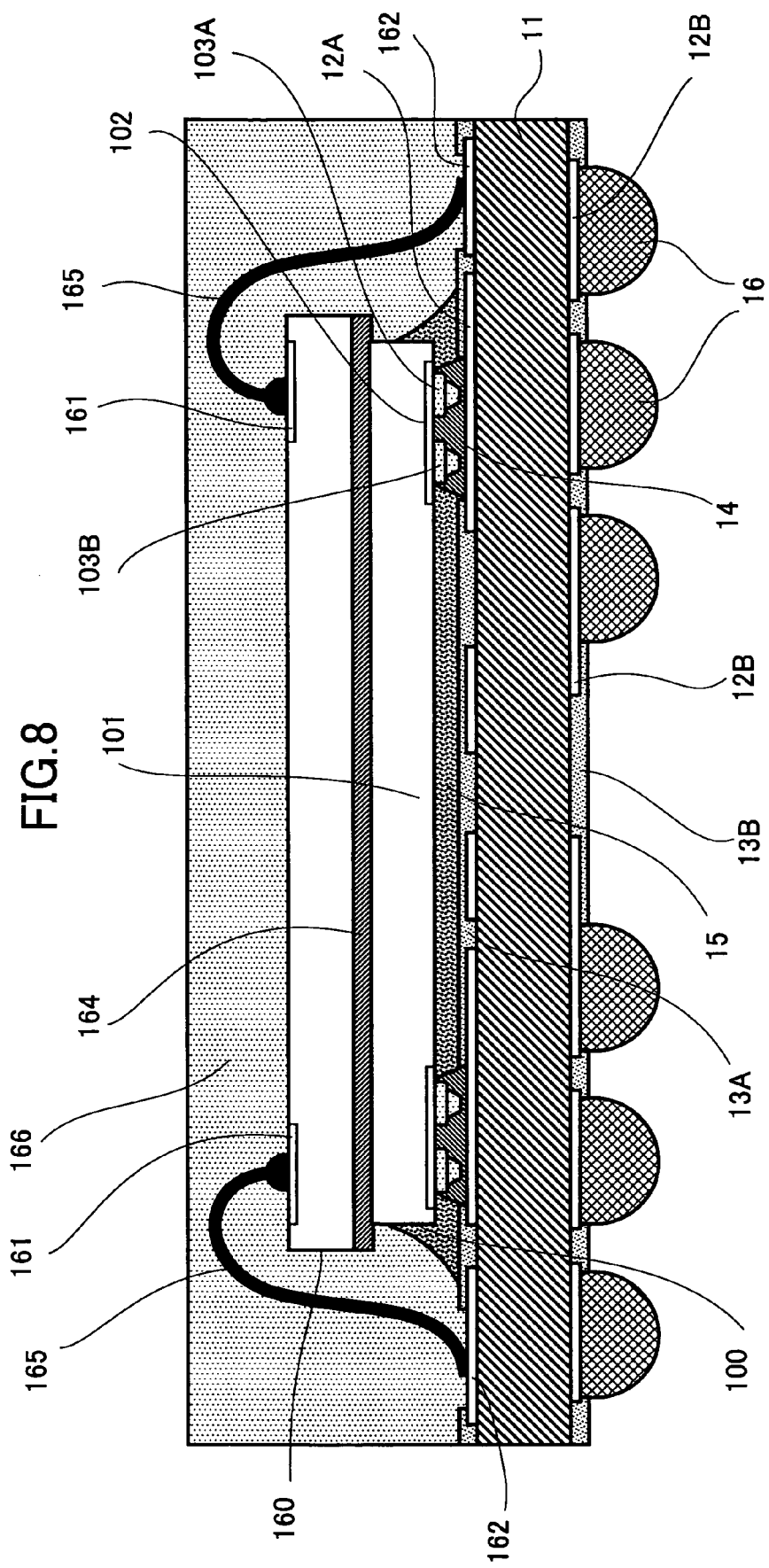
FIG. 8 is a cross-sectional view of a semiconductor device of a third embodiment of the present invention.

A semiconductor device of a third embodiment of the present invention is shown in FIG. 8. Here, FIG. 8 is a cross-sectional view of the semiconductor device of the third embodiment of the present invention.

In the third embodiment of the present invention, parts that are the same as the parts discussed in the first embodiment of the present invention are given the same reference numerals, and explanation thereof is omitted.

Referring to FIG. 8, the semiconductor device of the third embodiment of the present invention has a stacked semiconductor element structure where a second semiconductor element 160 is mounted, face up with a surface having outside connection pads 161 facing up, on a rear surface of the semiconductor element 100 (hereinafter "first semiconductor element 100" in this embodiment) of the semiconductor device of the first embodiment, which semiconductor element is flip chip connected on the supporting board 11.

The second semiconductor element 160 is fixed on the rear surface of the first semiconductor element 100 via an adhesive agent 164.

A film or paste resin adhesive of epoxy, polyimide, or the like can be used as the adhesive 164. However, the adhesive agent 164 is not limited to this.

The outside connection terminal pad 161 provided on the upper surface of the second semiconductor element 160 and a second semiconductor element conductive layer 162 of the supporting board 11 (hereinafter in this embodiment, the conductive layer 12A of the first embodiment is called a "first semiconductor element conductive layer 12A") are connected by a bonding wire 165.

The first semiconductor element 100 and the second semiconductor element 160 are sealed on the supporting board 11 by sealing resin 166. Silicon (Si) group resin, acrylic group resin, epoxy group resin, or the like can be use as the sealing resin 166. However, the sealing resin 166 is not limited to these examples.

Thus, the semiconductor device of this embodiment has a stacked structure where the second semiconductor element 160 is mounted on the first semiconductor element 100 mounted on the supporting board 11.

In the semiconductor device, the first semiconductor element 100 is flip chip connected on the supporting board 11, and then the second semiconductor element 160 is connected and fixed on the first semiconductor element 100. The outside connection terminal pad 161 of the second semiconductor element 160 and the second semiconductor element conductive layer 162 on the supporting board 11 are connected by wire bonding.

Then, the supporting board 11, the first semiconductor element 100, and the second semiconductor element 160 are sealed by the sealing resin 166. After that, the outside connection terminals 16 are formed on the other main surface of the supporting board 11.

Thus, in this embodiment, two convex-shaped outside connection terminals 103A and 103B are provided on a single outside connection terminal pad 102 of the first semiconductor element 100 and connected to and fixed to the conductive layer 12A provided on the main surface of the supporting board 11 via the connection member 14 commonly covering the convex-shaped outside connection terminals 103A and 103B.

Accordingly, the contact area with the connection member 14 provided between the convex-shaped outside connection terminals 103A and 103B of the semiconductor element 100 and the conductive layer 12A on the supporting board 11 is increased.

The convex-shaped outside connection terminals 103A and 103B are provided in a direction perpendicular to an extending direction of the edge part of the semiconductor element 100.

Hence, even if the stress, based on the difference between applied thermal stresses or mechanical stresses or the difference between coefficients of thermal expansion of the first semiconductor element 100 and the supporting board 11, is concentrated in the manufacturing process on the connection member 14 between the convex-shaped outside connection terminals 103A and 103B provided on the semiconductor substrate 101 of the first semiconductor element 100 and the conductive layer 12A on the supporting board 11, the stress is scattered in a wide range.

Therefore, the probability of a crack being generated in an entire area of the connection member 14 provided between the convex-shaped outside connection terminals 103A and 103B of the first semiconductor element 100 and the conductive layer 12A on the supporting board 11 is drastically decreased. Thus, in this embodiment, it is possible to realize the electrical and mechanical connections between the first semiconductor element 100 and the supporting board 11 with high reliability.

The structure shown in FIG. 2 or FIG. 3 may be applied as the structure of the conductive layer 12A in this embodiment. In addition, the structure shown in FIG. 4 may be applied as the structure of the convex-shaped outside connection terminals 103A and 103B.

Furthermore, the process shown in FIG. 5 may be applied as a process for mounting the first semiconductor element 100 on the supporting board 11.

Fourth Embodiment

Figure 9:
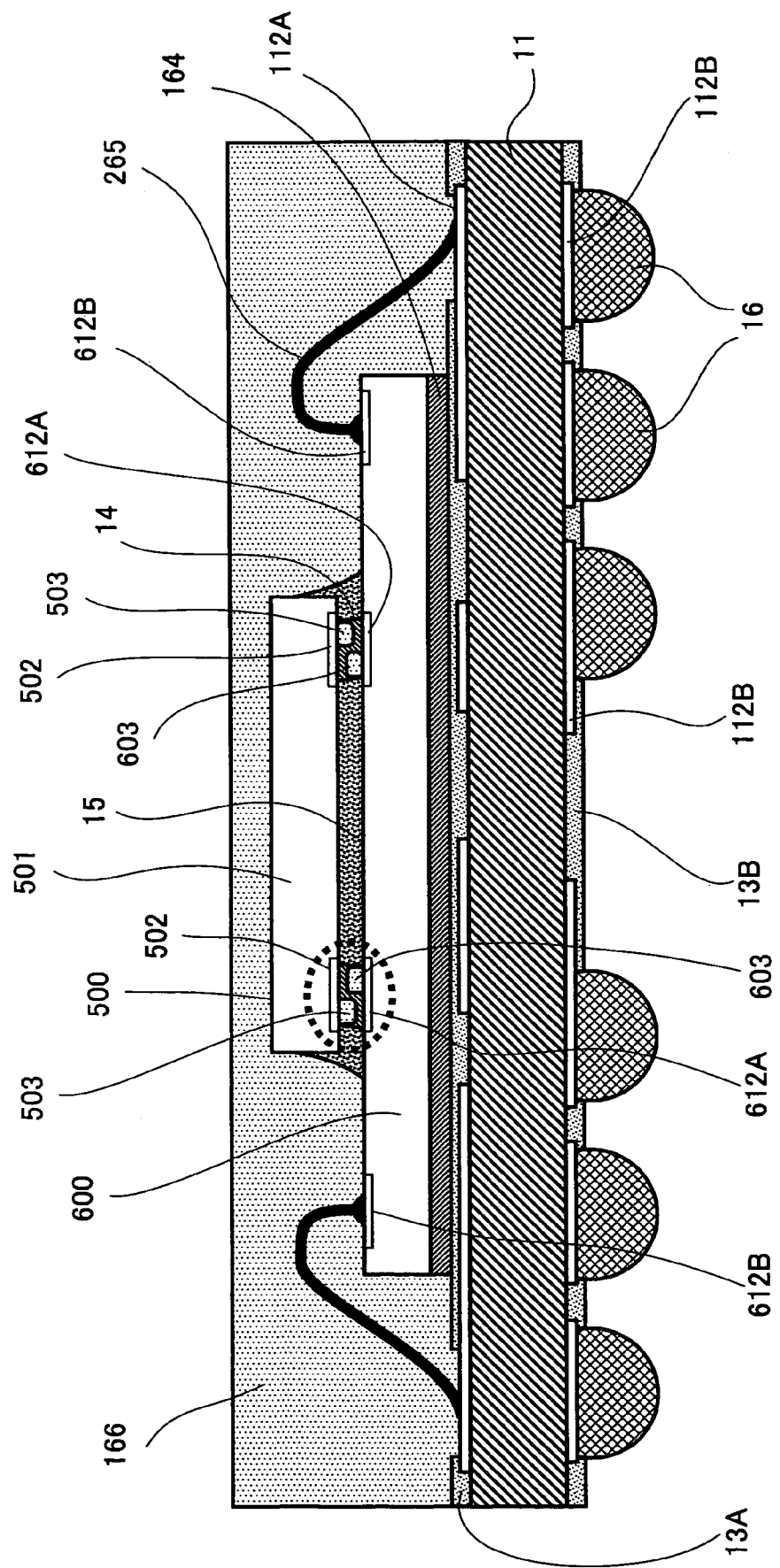
FIG. 9 is a cross-sectional view of a semiconductor device of a fourth embodiment of the present invention.
Figure 10:
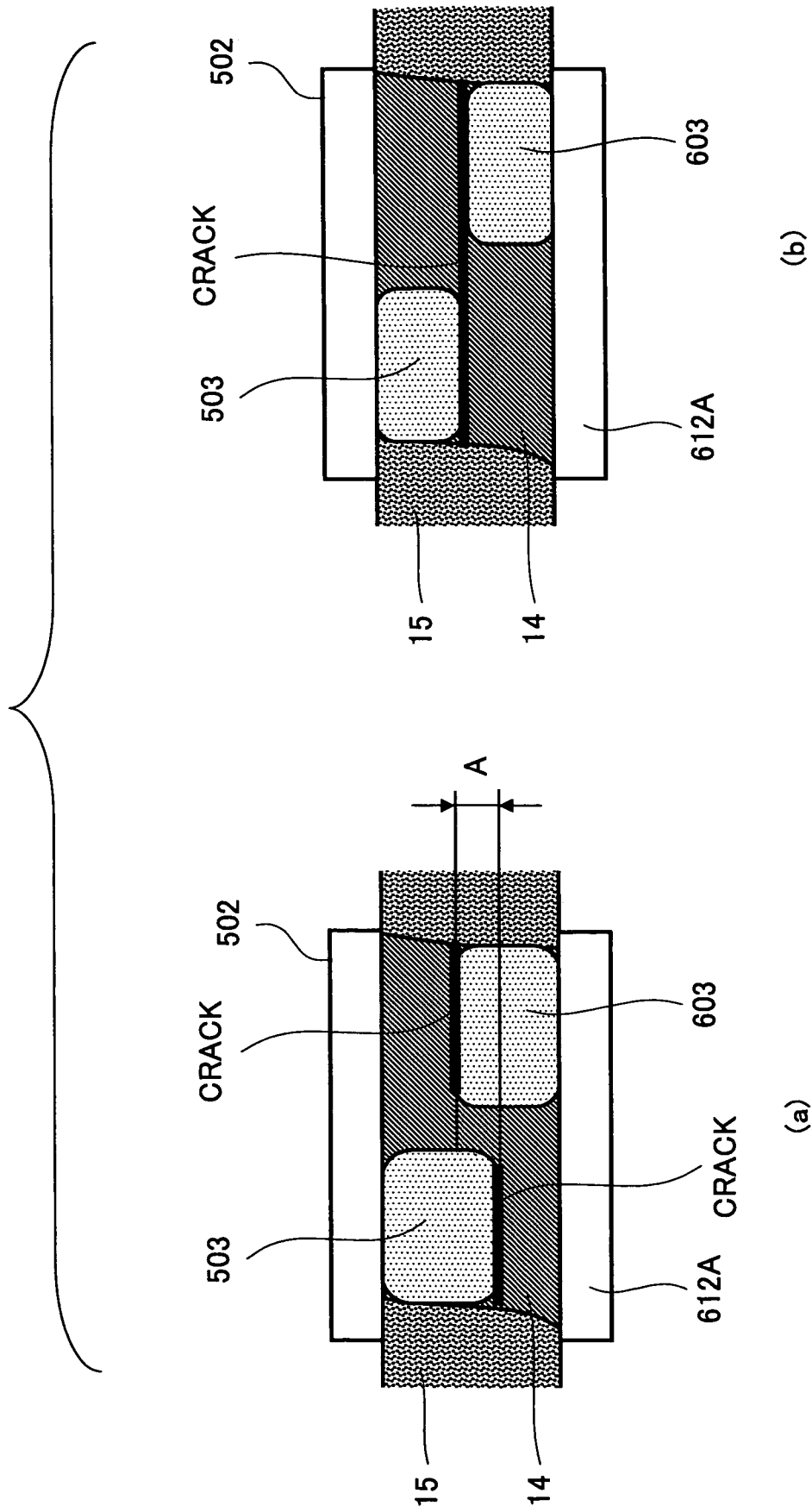
FIG. 10 is an enlarged view of a part surrounded by dotted lines in FIG. 9.

A semiconductor device of a fourth embodiment of the present invention is shown in FIG. 9 and FIG. 10.

Here, FIG. 9 is a cross-sectional view of the semiconductor device of the fourth embodiment of the present invention. FIG. 10 is a view of a part surrounded by dotted lines in FIG. 9.

In the fourth embodiment of the present invention, parts that are the same as the parts discussed in the first through third embodiments of the present invention are given the same reference numerals, and explanation thereof is omitted.

Referring to FIG. 9, in the semiconductor device of this embodiment, a semiconductor element 500 is mounted on the supporting board 11 via a wiring board 600.

The wiring board 600 functions as a relay board, namely a terminal chip configured to connect the supporting board 11 and the semiconductor element 500.

A conductive layer 112A made of copper (Cu) is selectively provided on a main surface of the supporting board 11.

The conductive layer 112A includes a wiring layer and a conductive layer to which a bonding wire 265 is connected.

The bonding wire 265 is connected to the supporting board 11 and the wiring board 600. The conductive layer 112A except for an area where the bonding wire 265 is connected is selectively covered with the solder resist layer 13A. In other words, the solder resist layer 13A is removed from an area of the conductive layer 112A where the wring board 600 is connected.

On the other hand, the wiring board 600 is formed by an organic insulation board made of, for example, glass epoxy, glass BT (Bismaleimide-Triazine), polyimide, or the like. The wiring board 600 is fixed on the supporting board 11 via the adhesive agent 164.

Plural outside connection terminal pads 612A made of copper (Cu) are provided, as corresponding to the outside connection terminal pads 502 of the semiconductor element 500, on an upper surface of the wiring board 600, namely the surface where the semiconductor element 500 is mounted. A single convex-shaped outside connection terminal 603 is provided on the outside connection terminal pad 612A.

Plural outside connection terminal pads 612B made of copper (Cu) are situated on the upper surface of the wiring board 600 and in the periphery of the semiconductor element 500. The outside connection pads 612B are provided in the vicinities of fours sides of the main surface of the wiring board 600 or the vicinities of two sides facing each other of the main surface of the wiring board 600.

The outside connection terminal pad 612A is connected to the corresponding outside connection terminal pad 612B by a wiring layer (not shown) formed on a surface or inside of the wiring board 600.

It is preferable that a plating layer made of nickel (Ni)/gold (Au) or copper (Cu)/nickel (Ni)/gold (Au) from the lower layer side be formed on the surfaces of the pads 612A and 612B.

A semiconductor substrate made of, for example, silicon (Si) or gallium arsenide (GaAs), is used for the semiconductor element 500, as well as the semiconductor element 100 of the first through third embodiments, and is formed by a well-known semiconductor manufacturing process.

Plural outside connection terminal pads 502 are provided on the main surface of the semiconductor element 500. A single convex-shaped outside connection terminal 503 is provided on the outside connection terminal pad 502.

The semiconductor element 500 is mounted on the wiring board 600 by a so-called flip chip method. In this case, a head end part of the convex-shaped outside connection terminal 503 provided on the outside connection terminal pad 502 of the semiconductor element 500 and a head end part of the convex-shaped outside connection terminal 603 provided on the outside connection terminal pad 612A of the semiconductor element 600 do not face each other. In other words, the positions of these head end parts on a surface parallel to the surface of the semiconductor element 500 or the wiring board 600 are different (offset). The convex-shaped outside connection terminals 503 and 603 are provided in a direction perpendicular to an extending direction of the edge part of the semiconductor element 500.

In addition, the convex-shaped outside connection terminals 503 and 603 are stacked (overlap each other) in a direction perpendicular to a plane surface, that is, a thickness direction of the semiconductor element 500 or the wiring board 600.

The convex-shaped outside connection terminals 503 and 603 are mechanically and electrically connected by the connection member 14 made of solder or a conductive adhesive agent. The underfill member 15 whose main ingredient is epoxy group resin is supplied between the semiconductor element 500 and the wiring board 600 so that the semiconductor element 500 is fixed to the wiring board 600.

The outside connection terminal pad 612B at the wiring board 600 and the conductive layer 112A of the supporting board 11 are connected by the bonding wire 265.

Furthermore, the supporting board 11 and the first semiconductor element 100 are sealed by sealing resin 166. The outside connection terminals 16 are provided on the other main surface of the supporting board 11.

Under this structure, an inorganic insulation substrate made of, for example, ceramic or glass, or a semiconductor substrate made of, for example, silicon (Si) or gallium arsenide (GaAs) can be applied as the wiring board 600.

In a case where the semiconductor substrate is used as the wiring board 600, the same process as a wafer process for forming the semiconductor element can be applied so that the outside connection terminal pad 612 can be made of aluminum (Al), copper (Cu), alloys of these such as Al95%-Cu5% alloy, or the like.

In a case where the wiring board 600 is formed of silicon (Si) the same as that used for the semiconductor element 500 mounted on the wiring board 600, the coefficients of thermal expansion of the wiring board 600 and the semiconductor element 500 can be substantially the same. Hence, stress in the connection member 14 provided between the outside connection terminal pad 502 of the semiconductor element 500 and the outside connection terminal pad 612A of the wiring board 600 can be reduced.

Therefore, mechanical and electrical connections between the semiconductor element 500 and the wiring board 600 can be realized with high reliability.

By applying the wafer process, the pitch between the outside connection terminal pads 502 and the 612A can be made more minute; thereby it is possible to make the semiconductor device small and highly integrated. In addition, the number of the outside connection terminal pads 502 of the semiconductor element 500 can be easily increased so that it is possible to correspond to high functionality of the semiconductor device and a large number of bits of the semiconductor device.

In a case where a semiconductor substrate is applied as the wiring board 600, a semiconductor integrated circuit may be formed on the wiring board 600.

By forming the semiconductor integrated circuit on the wiring board 600, it is possible to form a COC (Chip-On-Chip) type semiconductor device wherein plural semiconductor elements are mounted in three dimensions so as to be packed, and thereby a mounting area can be made small.

In addition, if necessary, a multi-layer wiring structure may be applied to the wiring board 600. Furthermore, a passive element such as an inductor, a capacitive element, a resistive element, or the like, may be mounted or formed on a surface or on a wiring part of an internal layer of the wiring board 600.

As discussed above, in this embodiment, a head end part of the convex-shaped outside connection terminal 503 provided on the outside connection terminal pad 502 of the semiconductor element 500 and a head end part of the convex-shaped outside connection terminal 603 provided on the outside connection terminal pad 612A of the semiconductor element 600 do not face each other. In other words, the positions of these head end parts on a surface parallel to the surface of the semiconductor element 500 or the wiring board 600 are offset. The convex-shaped outside connection terminals 503 and 603 are stacked (overlap each other) in a direction perpendicular to a plane surface. The convex-shaped outside connection terminals 503 and 603 are mechanically and electrically connected and fixed to each other by the connection member 14.

A mutual connection structure of such convex-shaped outside connection terminals 503 and 603 is shown in an expanded view in FIG. 10-(A).

The position of the convex-shaped outside connection terminal 503 on the outside connection terminal pad 502 and the position of the convex-shaped outside connection terminal 603 on the outside connection terminal pad 612A are offset from each other in a plane surface parallel to the surface of the semiconductor element 500 or the wiring board 600. Theses positions are offset from each other in a horizontal direction in FIG. 9, namely a width direction of the semiconductor element 500 or the wiring board 600.

In addition, the convex-shaped outside connection terminals 503 and 603 are stacked (overlap each other) by the amount corresponding to the measurement A in a direction perpendicular to a plane surface, that is, a thickness direction of the semiconductor element 500 or the wiring board 600.

Under such a connection and fixing structure, the positions in a horizontal direction of the convex-shaped outside connection terminals 503 and 603 are different from each other and the head end parts of the convex-shaped outside connection terminals 503 and 603 are positioned in different plane surfaces.

Therefore, even if cracks due to thermal or mechanical stress are generated in an interface of the head end part of the convex-shaped outside connection terminal 503 and the connection member 14 and in an interface of the head end part of the convex-shaped outside connection terminal 603 and the connection member 14, the crack at the head end part of one of the convex-shaped outside connection terminals does not spread (does not become connected) to the crack at the head end part of the other of the convex-shaped outside connection terminals so that a continuous crack is not generated.

Therefore, generation of a crack in the entire area of the connection member 14 covering the peripheries of the outside connection terminals 503 and 603 and breaking the connection member 14 based on the generation of a crack do not happen. Hence, it is possible to maintain the solid fixing and connection between the outside connection terminals 503 and 603.

In other words, according to a convex-shaped outside connection terminal structure in this embodiment, a part where the stress is concentrated so that a crack may be generated in the connection member 14 is scattered. Therefore, it is possible to realize the electrical and mechanical connection between the semiconductor element 500 and the wiring board 600.

As discussed above, the semiconductor substrate 1, the wiring board 600 and the semiconductor element 500 are resin sealed by the sealing resin 166.

Therefore, stress may be concentrated on the connection member 14 based on the thermal and/or mechanical stress applied during the manufacturing process of the semiconductor device or the difference between the coefficients of thermal expansion of the semiconductor element 500, the wiring board 600 and the supporting board 11.

However, in this embodiment, a head end part of the convex-shaped outside connection terminal 503 provided on the outside connection terminal pad 502 of the semiconductor element 500 and a head end part of the convex-shaped outside connection terminal 603 provided on the outside connection terminal pad 612A of the semiconductor element 600 do not face each other. In other words, the positions of these head end parts on a surface parallel to the surface of the semiconductor element 500 or the wiring board 600 are different (offset). The convex-shaped outside connection terminals 503 and 603 are stacked (overlap each other) in a direction perpendicular to a plane surface. The convex-shaped outside connection terminals 503 and 603 are mechanically and electrically connected and fixed each other by the connection member 14.

According to the above-discussed structure, a part where the stress is concentrated so that a crack may be generated is scattered. Therefore, it is possible to realize the electrical and mechanical connections between the semiconductor element 500 and the wiring board 600.

If the head end part of the convex-shaped outside connection terminal 503 provided on the outside connection terminal pad 502 and the head end part of the convex-shaped outside connection terminal 603 provided on the outside connection terminal pad 612A are, as shown in FIG. 10-(b), positioned in the same position in a thickness direction of the semiconductor element 500 (in a vertical direction shown in FIG. 10) in the same plane surface, the following problem may occur.

That is, in a case where cracks due to thermal or mechanical stress are generated in the interface of the convex-shaped outside connection terminal 503 and the connection member 14 and in the interface of the convex-shaped outside connection terminal 603 and the connection member 14, the crack at the head end part of one of the convex-shaped outside connection terminals may be easily spread (connect) to the crack at the head end part of the other of the convex-shaped outside connection terminals so that a continuous crack may be generated. This may eventually cause breakage of the connection member 14.

The structure, shown in FIG. 9 and FIG. 10-(a), where the convex-shaped outside connection terminals are provided on the electrode pads of the semiconductor element and the supporting board and the positions and heights of the convex-shaped outside connection terminals are selected so that the electrode pads of the semiconductor element and the supporting board are connected by plural convex-shaped outside connection terminals, can be applied to a mounting structure of the semiconductor element in the first through third embodiments of the present invention.

Figure 11:
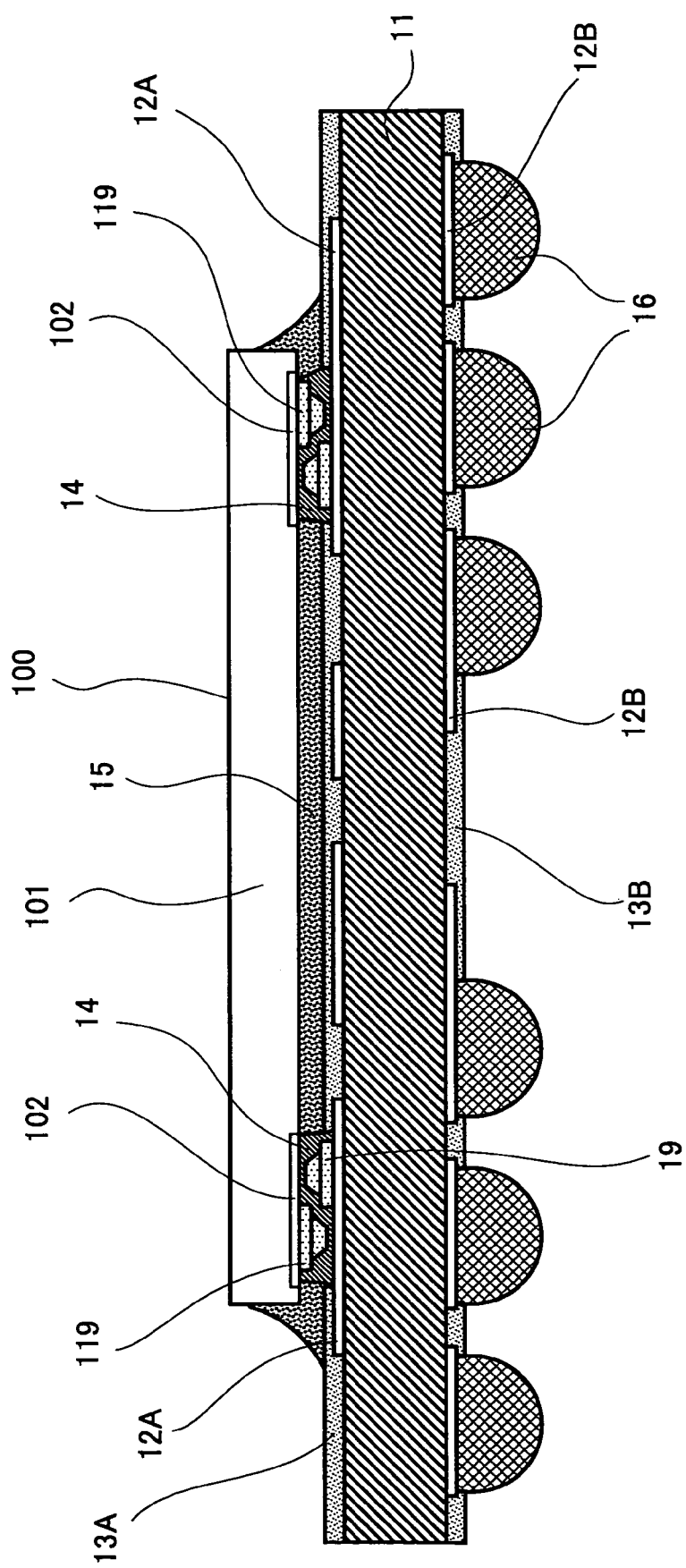
FIG. 11 is a cross-sectional view of a semiconductor device shown in FIG. 1 to which a connection structure of an outside connection terminal pad of the semiconductor element of the four embodiment of the present invention and an outside connection terminal pad of the wiring board, is applied.

An example is shown in FIG. 11 where the convex-shaped outside connection terminals are provided on the electrode pads of the semiconductor element and the supporting board with the positions and heights of the convex-shaped outside connection terminals being offset and overlapped, respectively, are applied to the semiconductor device of the first embodiment.

Referring to FIG. 11, the convex-shaped outside connection terminal 19 is provided on the conductive layer 12A of the supporting board 11. The convex-shaped outside connection terminal 119 is provided on the outside connection terminal pad 102 of the semiconductor element 100.

That is, a head end part of the convex-shaped outside connection terminal 19 provided on the outside connection terminal pad 102 of the semiconductor element 100 and a head end part of the convex-shaped outside connection terminal 119 provided on the conductive layer 12A of the supporting board 11 do not face each other. In other words, the positions of these head end parts on a surface parallel to the surface of the semiconductor element 100 or the supporting board 11 are offset. The convex-shaped outside connection terminals 19 and 119 are stacked (overlap each other) in a direction perpendicular to a plane surface. The convex-shaped outside connection terminals 19 and 119 are mechanically and electrically connected and fixed to each other by the connection member 14.

The convex-shaped outside connection terminals 19 and 119 are provided in a direction perpendicular to an extending direction of the edge part of the semiconductor element 100.

According to the structure in this embodiment, a part where the stress is concentrated that may cause a crack in the connection member 14 is scattered. Therefore, it is possible to form reliable electrical and mechanical connections between the semiconductor element 100 and the supporting board 11.

A main part of a manufacturing process of the semiconductor device of the fourth embodiment of the present invention is discussed with reference to FIG. 12.

Figure 12:
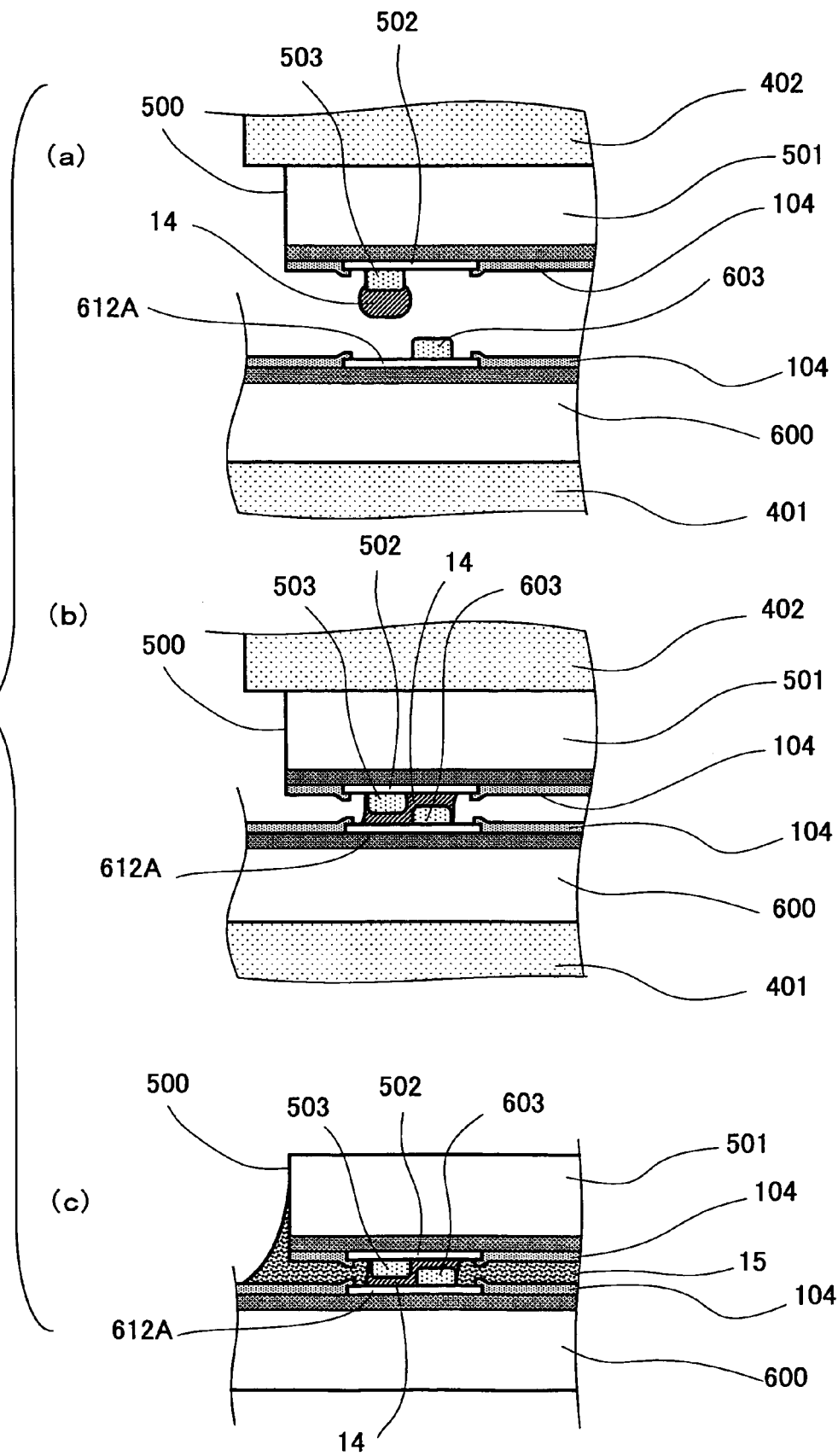
FIG. 12 is a cross-sectional view showing a manufacturing process of the semiconductor device of the fourth embodiment of the present invention.

FIG. 12-(*a*) shows a state where the wiring board 600 mounted and fixed on the bonding stage 401 and the semiconductor element 500 held by the suction jig 402 face each other.

The convex-shaped outside connection terminal 503 is formed on the outside connection terminal pad 502 of the semiconductor element 500. The convex-shaped outside connection terminal 603 is formed on the outside connection terminal pad 612A of the wiring board 600.

The peripheries of the outside connection terminal pads 502 and 612A are covered with the surface protection layer 104 made of nitride silicon ($Si_3N_4$).

As shown in FIG. 12, the head end part of the convex-shaped outside connection terminal 503 provided on the outside connection terminal pad 502 of the semiconductor element 500 and the head end part of the convex-shaped outside connection terminal 603 provided on the outside connection terminal pad 612A of the semiconductor element 600 do not face each other. In other words, the positions of these head end parts on a surface parallel to the surface of the semiconductor element 500 or the wiring board 600 are offset.

Before the wiring board 600 mounted and fixed on the bonding stage 401 and the semiconductor element 500 held by the suction jig 402 face each other, the connection member 14 is formed, in advance, on at least one of the convex-shaped outside connection terminal 503 of the semiconductor element 500 and the convex-shaped outside connection terminal 603 of the semiconductor element 600.

In an example shown in FIG. 12, the connection member 14 is formed on the head end of the convex-shaped outside connection terminal 503 provided on the outside connection terminal pad 502 of the semiconductor element 500. However, the present invention is not limited to this example. The connection member 14 may be formed on the head end of the convex-shaped outside connection terminal 603 provided on the outside connection terminal pad 612A of the wiring board 600. In addition, the connection member 14 may be formed on both the convex-shaped outside connection terminals 503 and 603.

By forming the connection member 14 on both the convex-shaped outside connection terminals 503 and 603, it is possible to uniformly provide the connection member 14 between the outside connection terminal pads 502 and 612A.

In a case where the connection member 14 is made of conductive resin such as a thermosetting conductive epoxy resin paste with a silver filler, the connection member 14 can be uniformly provided by forming the connection member 14 on both the convex-shaped outside connection terminals 503 and 603. Thus, where the semiconductor element 500 and the wiring board 600 face each other, the bonding stage 401 is heated to temperature equal to or higher than the melting point of the connection member 14 such as approximately 280° C. through 300° C. and the suction jig 402 is lowered and thereby the convex-shaped outside connection terminals 503 and 603 are pressed in the molten connection member 14.

At this time, the absorption jig 402 is also heated to the designated temperature such as approximately 80° C. through 200° C.

As a result of this, the connection member 14 covers the convex-shaped outside connection terminals 503 and 603 and comes in contact with exposed surfaces of the outside connection terminal pads 502 and 612A so that the outside connection terminal pads 502 and 612A are connected. At this time, a space between the convex-shaped outside connection terminals 503 and 603 is filled with the connection member 14.

Furthermore, at this time, the convex-shaped outside connection terminals 503 and 603 are stacked (overlap each other) by the amount corresponding to the measurement A as shown in FIG. 10-(*a*), in a direction perpendicular to a plane surface, that is, a thickness direction of the semiconductor element 500 or the wiring board 600. This state is shown in FIG. 12-(*b*).

Thus, the outside connection terminal pad 502 and the convex-shaped outside connection terminal 603, and the outside connection terminal pad 612A and the convex-shaped outside connection terminal 503, are connected and fixed by the connection member 14 so that the semiconductor element 500 is mounted on the wiring board 600. After that, the underfill member 15 whose main ingredient is epoxy group resin is supplied between the wiring board 600 and the semiconductor element 500. This state is shown in FIG. 12-(*c*).

Then, the wiring board 600 is mounted on the supporting board 11 and the terminal pad 612B on the wiring board 600 and the conductive layer 112A on the wiring board 11 are connected by the bonding wire 265.

Next, the supporting board 11, the wiring board 600 and the semiconductor element 500 are sealed by the sealing resin 166.

After that, the outside connection terminals 16 are provided on the other main surface of the supporting board 11 so that the semiconductor device shown in FIG. 9 is formed.

Fifth Embodiment

Figure 13:
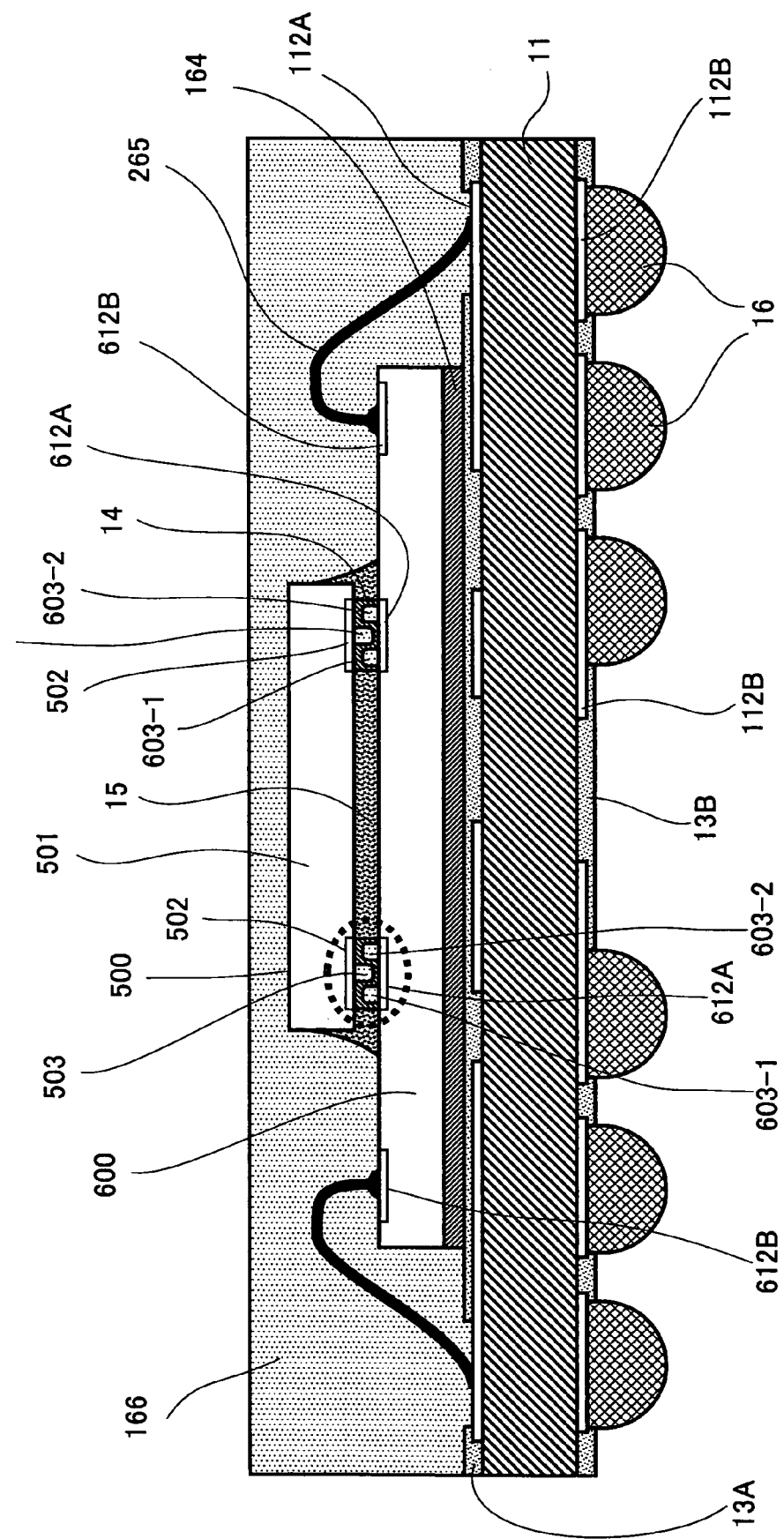
FIG. 13 is a cross-sectional view of a semiconductor device of a fifth embodiment of the present invention.
Figure 14:
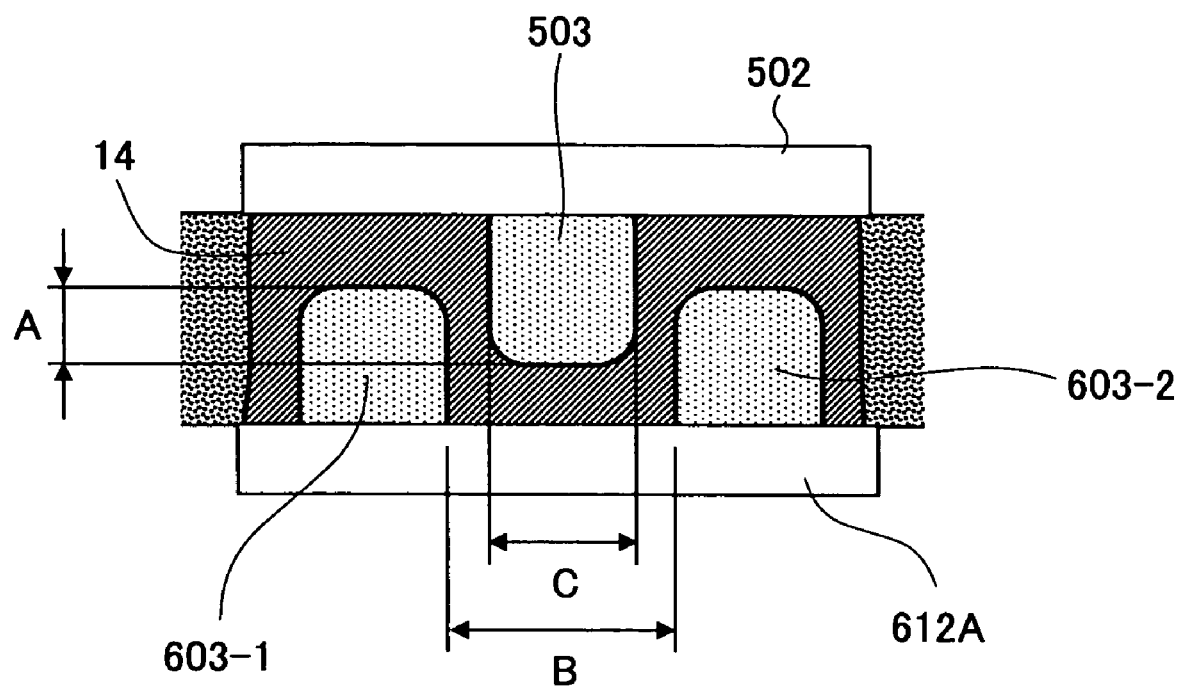
FIG. 14 is an enlarged view of a part surrounded by dotted lines in FIG. 13.

A semiconductor device of a fifth embodiment of the present invention is shown in FIG. 13 and FIG. 14.

Here, FIG. 13 is a cross-sectional view of the semiconductor device of the fifth embodiment of the present invention. FIG. 14 is a view of a part surrounded by dotted lines in FIG. 13.

In the fifth embodiment of the present invention, parts that are the same as the parts discussed in the first through fourth embodiments of the present invention are given the same reference numerals, and explanation thereof is omitted.

Referring to FIG. 13 and FIG. 14, in the semiconductor device of the fifth embodiment, a single convex-shaped outside connection terminal 503 is provided in the substantially center part of the outside connection terminal pad 502 of the semiconductor element 500.

On the other hand, two convex-shaped outside connection terminals 603-1 and 603-2 are provided on the outside connection terminal pad 612A of the wiring board 600 with a designated gap B. See FIG. 14.

The gap B between the convex-shaped outside connection terminals 603-1 and 603-2 is slightly longer than the thickness C of the convex-shaped outside connection terminal 503 provided on the outside connection terminal pad 502 of the semiconductor element 500. See FIG. 14.

Because of such an arrangement of the convex-shaped outside connection terminals, when the semiconductor element 500 is flip chip connected and fixed on the wiring board 600, the convex-shaped outside connection terminal 503 provided on the outside connection terminal pad 502 of the semiconductor element 500 is received between the convex-shaped outside connection terminals 603-1 and 603-2 on the outside connection terminal pad 612A of the wiring board 600, while the head end part of the convex-shaped outside connection terminal 503 does not face the convex-shaped outside connection terminals 603-1 and 603-2.

The convex-shaped outside connection terminals 503, 603-1 and 603-2 are provided in a direction perpendicular to an extending direction of the edge part of the semiconductor element 500.

Furthermore, the convex-shaped outside connection terminals 503, 603-1, and 603-2 are stacked (overlap each other) by the amount corresponding to the measurement A in a direction perpendicular to a plane surface, that is, a thickness direction of the semiconductor element 500 or the wiring board 600. See FIG. 14.

According to such a connection and fixing structure, the convex-shaped outside connection terminals 603-1 and 603-2 are positioned one at each side of the convex-shaped outside connection terminal 503. Hence, as compared to the embodiments discussed above, the contact area with the connection member 14 is increased. Therefore, it is possible to heighten the connection and fixing strength of the semiconductor element 500 against the wiring board 600.

In addition, according to such a connection and fixing structure, the positions in a horizontal direction of the convex-shaped outside connection terminals 503, 603-1 and 603-2 are different and the head end parts of the convex-shaped outside connection terminals 503, 603-1 and 603-2 are situated in different plane surface.

Accordingly, even if cracks due to the thermal or mechanical stress are generated in an interface of the head end part of the convex-shaped outside connection terminal 503 and the connection member 14 and in an interface of the head end part of the convex-shaped outside connection terminals 603-1 and 603-2 and the connection member 14, a crack at the head end part of one of the convex-shaped outside connection terminals does not spread (connect) to a crack at the head end part of the other of the convex-shaped outside connection terminals. In other words, since three convex-shaped outside connection terminals situated in different positions in a horizontal direction and the head end parts of the convex-shaped outside connection terminals are positioned in different plane surfaces, a crack at the head end parts does not continue to spread.

Therefore, generation of a crack in the entire area of the connection member 14 covering the peripheries of the outside connection terminals 503 and 603 and breaking of the connection member 14 based on the generation of a crack do not happen. Hence, it is possible to maintain the solid fixing and connection between the outside connection terminals 503 and 603.

In this embodiment shown in FIG. 13 and FIG. 14, a single convex-shaped outside connection terminal 503 is provided on the outside connection terminal pad 502 of the semiconductor element 500, and two convex-shaped outside connection terminals 603-1 and 603-2 are provided on the outside connection terminal pad 612A of the wiring board 600. However, the present invention is not limited to this example.

Plural convex-shaped outside connection terminals 503 may be provided on the outside connection terminal pad 502 of the semiconductor element 500, and a single convex-shaped outside connection terminal 603 may be provided on the outside connection terminal pad 612A of the wiring board 600. Alternatively, plural convex-shaped outside connection terminals 503 may be provided on the outside connection terminal pad 502 of the semiconductor element 500, and plural convex-shaped outside connection terminals 603 may be provided on the outside connection terminal pad 612A of the wiring board 600.

In any structure, it is required that the positions in a horizontal direction of the convex-shaped outside connection terminals 503 and 603 be different and the head end parts of the convex-shaped outside connection terminals 503 and 603 be situated in different plane surfaces.

Next, a main part of the manufacturing process of the semiconductor device of the fifth embodiment of the present invention is discussed with reference to FIG. 15.

Figure 15:
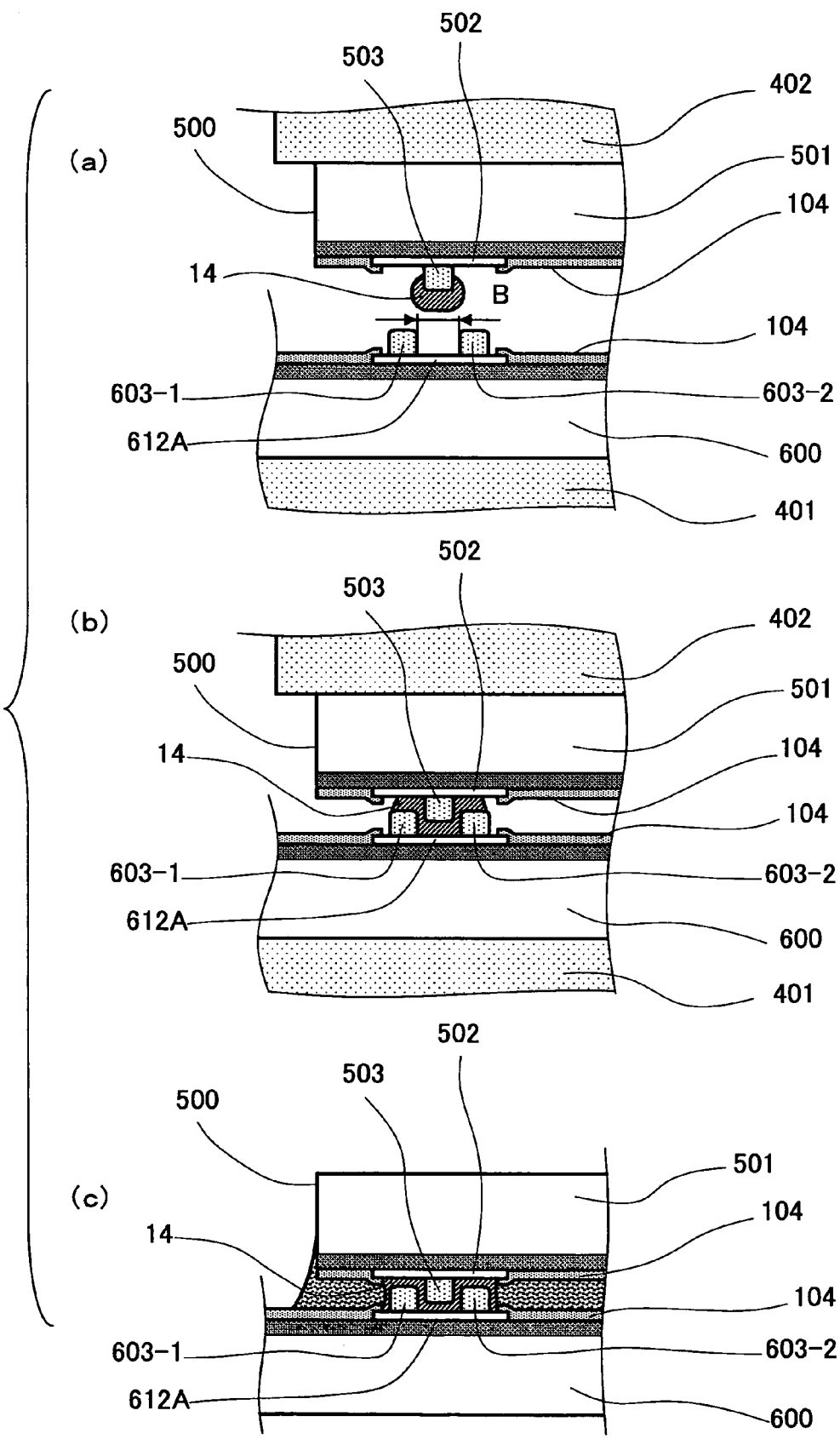
FIG. 15 is a cross-sectional view showing a manufacturing process of the semiconductor device of the fifth embodiment of the present invention.

FIG. 15-(a) shows a state where the wiring board 600 mounted and fixed on the bonding stage 401 and the semiconductor element 500 held by the suction jig 402 face each other.

The convex-shaped outside connection terminal 503 is formed on the outside connection terminal pad 502 of the semiconductor element 500. Two convex-shaped outside connection terminals 603-1 and 603-2 are formed on the outside connection terminal pad 612A of the wiring board 600.

The peripheries of the outside connection terminal pads 502 and 612B are covered with the surface protection layer 104 made of nitride silicon ($Si_3N_4$).

As shown in FIG. 15, the head end part of the convex-shaped outside connection terminal 503 provided on the outside connection terminal pad 502 of the semiconductor element 500 and the head end part of the convex-shaped outside connection terminals 603-1 and 603-2 provided on the outside connection terminal pad 612A of the semiconductor element 600 do not face each other. In other words, the positions of these head end parts on a surface parallel to the surface of the semiconductor element 500 or the wiring board 600 are different. The convex-shaped outside connection terminal 503 provided on the outside connection terminal pad 502 of the semiconductor element 500 is provided between the convex-shaped outside connection terminals 603-1 and 603-2 provided on the outside connection terminal pad 612A of the semiconductor element 600.

Before the wiring board 600 mounted and fixed on the bonding stage 401 and the semiconductor element 500 held by the suction jig 402 face each other, the connection member 14 is formed, in advance, on at least one of the convex-shaped outside connection terminal 503 of the semiconductor element 500 and the convex-shaped outside connection terminal 603 of the semiconductor element 600. In an example shown in FIG. 15, the connection member 14 is formed on the head end of the convex-shaped outside connection terminal 503 provided on the outside connection terminal pad 502 of the semiconductor element 500.

Thus, in the state where the semiconductor element 500 and the wiring board 600 face each other, the bonding stage 401 is heated to a temperature equal to or higher than the melting point of the connection member 14 such as approximately 280° C. through 300° C. and the suction jig 402 is lowered and thereby the convex-shaped outside connection terminals 503 and 603 are pressed in the molten connection member 14.

At this time, the suction jig 402 is also heated to a designated temperature such as approximately 80° C. through 200° C.

As a result of this, the connection member 14 covers the convex-shaped outside connection terminals 503 and 603-1 and 603-2 and comes in contact with an exposed surface of the outside connection terminal pads 502 and 612A so that the outside connection terminal pads 502 and 612A are connected. At this time, a space between the convex-shaped outside connection terminals 503 and 603-1 and 603-2 is filled with the connection member 14.

Furthermore, at this time, the convex-shaped outside connection terminals 503 and 603 are stacked (overlap each other) by the amount corresponding to the measurement A, in a direction perpendicular to a plane surface, that is, a thickness direction of the semiconductor element 500 or the wiring board 600. This state is shown in FIG. 15-(b).

Thus, the outside connection terminal pad 502 and the convex-shaped outside connection terminal 603, and the outside connection terminal pad 612A and the convex-shaped outside connection terminal 503 are connected and fixed by the connection member 14 so that the semiconductor element 500 is mounted on the wiring board 600. After that, the underfill member 15 whose main ingredient is epoxy group resin is supplied between the wiring board 600 and the semiconductor element 500. This state is shown in FIG. 15-(c).

Then, the wiring board 600 is mounted on the supporting board 11 and the terminal pad 612B on the wiring board 600 and the conductive layer 112A on the wiring board 11 are connected by the bonding wire 265.

Next, the supporting board 11, the wiring board 600 and the semiconductor element 500 are sealed by the sealing resin 166.

After that, the outside connection terminals 16 are provided on the other main surface of the supporting board 11 so that the semiconductor device shown in FIG. 13 is formed.

The present invention is not limited to these embodiments, but variations and modifications may be made without departing from the scope of the present invention.

The convex-shaped outside connection terminal provided on the outside connection terminal pad of the semiconductor element may be formed of gold (Au), copper (Cu), nickel (Ni), alloy of these or the like. For example, a ball bump formed by a wire ball bonding method using a metal wire or a bump formed by a plating method may be applied to the convex-shaped outside connection terminal.

In addition, in a case where the wiring board is made of an organic insulation material such as glass epoxy, glass BT (Bismaleimide-Triazine), polyimide, or the like or an inorganic insulation material such as ceramic or glass, the outside connection terminal pad may be formed of copper (Cu) having a surface of double layers plating of nickel (Ni)/gold (Au) from a lower surface side, or of a triple layer plating of copper (Cu)/nickel (Ni)/gold (Au) from a lower surface side. The convex-shaped outside connection terminal may be formed on the outside connection terminal pad by a wire ball bonding method using a metal wire made of gold (Au), copper (Cu), alloy of these, and others.

Alternatively, the convex-shaped outside connection terminal made of silver (Ag) or the like may be formed on the outside connection terminal pad made of copper (Cu) or the like by a printing method, a transferring method, an ink jet printing method, or the like. Then, a double layer plating of nickel (Ni)/gold (Au) from a lower surface side, or a triple layer plating of copper (Cu)/nickel (Ni)/gold (Au) from a lower surface side may be formed on the entire area of the outside connection terminal pad and the convex-shaped outside connection terminal.

Furthermore, an etching process may be applied to the outside connection terminal pad made of copper (Cu) so that the convex-shaped outside connection terminal is partially formed. Then, a double layer plating of nickel (Ni)/gold (Au) from a lower surface side, or a triple layer plating of copper (Cu)/nickel (Ni)/gold (Au) from a lower surface side may be formed.

Alternatively, a copper (Cu) plating may be partially applied to the outside connection terminal pad made of copper (Cu) so that the convex-shaped outside connection terminal is formed. Then, a double layer plating of nickel (Ni)/gold (Au) from a lower surface side, or a triple layer plating of copper (Cu)/nickel (Ni)/gold (Au) from a lower surface side may be formed.

On the other hand, when the wiring board is made of silicon (Si) or gallium arsenide (GaAs), the outside connection terminal pad may be formed of aluminum (Al), copper (Cu), alloy of these, or the like and a metal film of nickel (Ni)/gold (Au)/titanium (Ti)/tungsten (W)/gold (Au), titanium (Ti)/palladium (Pd)/gold (Au), or titanium (Ti)/nickel (Ni)/palladium (Pd)/gold (Au) from a lower layer side, may be formed on the outside connection terminal pad. The convex-shaped outside connection terminal may be formed on the metal film by using a wire ball bonding method using a metal wire made of gold (Au), copper (Cu), alloys of these, or the like.

Alternatively, a metal film of titanium (Ti)/tungsten (W), titanium (Ti)/tungsten (W)/gold (Au), titanium (Ti)/palladium (Pd), titanium (Ti)/palladium (Pd)/gold (Au), titanium (Ti)/nickel (Ni)/palladium (Pd), or the like, from a lower layer side, may be formed on the outside connection terminal pad made of aluminum (Al), copper (Cu), alloys of these, or the like. The convex-shaped outside connection terminal made of gold (Au), copper (Cu), or the like may be formed on the metal film by an electrolytic plating method In addition, it is preferable that the gold (Au) layer be formed as the uppermost layer, namely a surface of a part of the outside connection terminal pad where at least a convex-shaped outside connection terminal is not formed, by the electrolytic plating method, the evaporation method, or the like.

Because of the gold (Au) layer, in a case where solder is used as the connection member, it is possible to ensure that the solder is wet spread on the uppermost layer, namely the surface of the outside connection terminal pad.

In addition, in a case where the ball bump is used as the convex-shaped outside connection terminal, the gold (Au) layer is, in advance, formed on the uppermost layer, namely a surface of a part of the outside connection terminal pad where the convex-shaped outside connection terminal is formed, so that the ball bump using a gold (Au) line can be easily formed.

When the base gold (Au) layer is formed, it is preferable that a metal layer of titanium (Ti), tungsten (W), palladium (Pd), nickel (Ni), alloys of these, or the like is formed, as a lower layer, between the gold (Au) layer and the surface (uppermost layer) of the convex-shaped outside connection terminal. It is possible to prevent the generation of corrosion of the outside connection terminal pad by the metal layer so that interlayer adhesion force can be improved.

More specifically, it is preferable that nickel (Ni), titanium (Ti)/tungsten (W)/, titanium (Ti)/palladium (Pd), or titanium (Ti)/nickel (Ni)/palladium (Pd) be provided between the gold (Au) layer and the surface (uppermost layer) of the convex-shaped outside connection terminal from a side of the outside connection terminal pad.

In addition, as the connection member, solder made of tin (Sn)-silver (Ag), tin (Sn)-silver (Ag)-copper (Cu), tin (Sn)-silver (Ag)-indium (In) or conductive resin such as epoxy resin including metal particle of silver (Ag), copper (Cu), copper (Cu) alloy, or the like or including a particles where a metal film of the above-mentioned metal is formed may be used.

Such a connection member may be formed by a selective electrolytic plating method on the surface of the outside connection terminal pad, a transferring method whereby the head end of the convex-shaped outside connection terminal comes in contact with the connection member layer having uniform thickness and applied on another substrate so that the connection member is adhered to the head end, or a method whereby a paste or a minute particle connection member is jetted from a micro nozzle so that the connection member is partially adhered to the head end of the convex-shaped outside terminal.

This patent application is based on Japanese Priority Patent Application No. 2005-188887 filed on Jun. 28, 2005 and Japanese Priority Patent Application No. 2006-61759 filed on Mar. 7, 2006, the entire contents of which are hereby incorporated by reference.

What is claimed is:

1. A semiconductor device, comprising:
    a semiconductor element having a main surface where an outside connection terminal pad is provided;
    wherein the semiconductor element is connected to, via a plurality of convex-shaped outside connection terminals and a connection member, a conductive layer on a supporting board, the plurality of convex-shaped outside connection terminals being provided on the outside connection terminal pad, the connection member being formed between the outside connection terminal pad on the semiconductor element and the conductive layer on the supporting board;
    the connection member includes solder and completely and commonly covers the convex-shaped outside connection terminals; and
    the convex-shaped outside connection terminals have a structure where a convex-shaped part projecting from a base part is formed in a body with the base part.

* * * * *